(12) United States Patent
Huff et al.

(10) Patent No.: US 9,053,929 B1
(45) Date of Patent: Jun. 9, 2015

(54) METHOD AND SYSTEM FOR INTEGRATED MEMS AND NEMS USING DEPOSITED THIN FILMS HAVING PRE-DETERMINED STRESS STATES

(75) Inventors: Michael A. Huff, Oakton, VA (US); Paul Sunal, Alexandria, VA (US)

(73) Assignee: Corporation For National Research Initiatives, Reston, VA (US)

( * ) Notice: Subject to any disclaimer, the term of this patent is extended or adjusted under 35 U.S.C. 154(b) by 0 days.

(21) Appl. No.: 13/111,473

(22) Filed: May 19, 2011

Related U.S. Application Data

(60) Provisional application No. 61/346,172, filed on May 19, 2010.

(51) Int. Cl.
*H01L 21/00* (2006.01)
*H01L 21/02* (2006.01)
*H01L 21/66* (2006.01)

(52) U.S. Cl.
CPC .... *H01L 21/02356* (2013.01); *H01L 21/02274* (2013.01); *H01L 22/12* (2013.01)

(58) Field of Classification Search
None
See application file for complete search history.

(56) References Cited

U.S. PATENT DOCUMENTS

| | | | | |
|---|---|---|---|---|
| 4,683,758 A | | 8/1987 | Hoffman et al. | |
| 5,444,302 A | * | 8/1995 | Nakajima et al. | 257/755 |
| 5,834,374 A | * | 11/1998 | Cabral et al. | 438/685 |
| 5,871,805 A | * | 2/1999 | Lemelson | 427/8 |
| 6,139,699 A | * | 10/2000 | Chiang et al. | 204/192.15 |
| 6,488,823 B1 | * | 12/2002 | Chiang et al. | 204/192.15 |

OTHER PUBLICATIONS

U.S. Appl. No. 13/111,391 of Huff et al., filed May 19, 2011.

* cited by examiner

*Primary Examiner* — Scott B Geyer
(74) *Attorney, Agent, or Firm* — Nixon & Vanderhye, PC

(57) ABSTRACT

A method and system are disclosed for controlling the state of stress in deposited thin films on microelectronics wafers for the integration of MEMS and NEMS devices with microelectronics. According to the method and system, various process parameters including: process pressure; substrate temperature; deposition rate; and ion-beam energies (controlled via the ion beam current, voltage, signal frequency and duty cycle) are varied using a step-by-step methodology to arrive at a pre-determined desired state of stress in thin films deposited using PVD at low temperatures and desired stress states onto wafers or substrates having microelectronics processing performed on them.

34 Claims, 15 Drawing Sheets

Figure 12: Pressure and Temperature Process Development for PVD

Figure 13: Bombardment Process Development for Evaporation PVD

Figure 14: Bombardment Process Development for Sputtering PVD

METHOD AND SYSTEM FOR INTEGRATED MEMS AND NEMS USING DEPOSITED THIN FILMS HAVING PRE-DETERMINED STRESS STATES

CROSS-REFERENCES TO RELATED APPLICATIONS

This application claims the benefit of Provisional Application No. 61/346,172, filed May 19, 2010.

FIELD OF INVENTION

The present invention is directed to a method and system for controlling the state of stress in deposited thin films on microelectronics wafers to a pre-determined value for the integration of MEMS and NEMS devices with microelectronics. This invention has application in microelectronics, nanoelectronics, micro-electro-mechanical systems (MEMS), nano-electro-mechanical systems (NEMS), photonics, and in other fields of endeavor that employ deposited thin films using physical vapor deposition (PVD) to implement integrated devices and structures.

BACKGROUND OF THE INVENTION

Advances in Micro-Electro-Mechanical Systems (MEMS) technology and Nano-Electro-Mechanical Systems (NEMS) technology promise to revolutionize commercial, defense, and industrial products by bringing together the computational capability of microelectronics with the perception and control capabilities of microsensors and microactuators, thereby enabling smart systems-on-a-chip to be mass-produced. The use of smart systems that can actively and autonomously sense and control their environments has far reaching implications for a tremendous number of future military, commercial, and industrial applications and promises significant benefits for the United States economy and its citizens. The real potential of MEMS and NEMS becomes fulfilled when these miniaturized sensors, actuators, and structures can be merged onto a common silicon substrate along with integrated circuits. While the electronics are fabricated using integrated circuit (IC) process sequences (e.g., CMOS, Bipolar, or BICMOS processes), the micromechanical components are fabricated using compatible "micromachining" processes that selectively etch away parts of the silicon wafer or add new structural layers to form the mechanical and electromechanical devices.

This vision of MEMS and NEMS, whereby micro-miniaturized sensors, actuators and microelectronics can be integrated onto a single microchip is expected to be a revolutionary technological breakthrough. This will enable the development of a new class of systems by augmenting the computational ability of microelectronics with the perception and control capabilities of micro- and nano-sensors and micro- and nano-actuators. Microelectronic integrated circuits can be thought of as the "brains" of a system, and MEMS and NEMS augments this decision-making capability with "eyes" and "arms", to allow micro- and nano-systems to sense and control the environment. Sensors gather information from the environment through measuring mechanical, thermal, biological, chemical, optical, and magnetic phenomena. The electronics then process the information derived from the sensors and through some decision making capability direct the actuators to respond by moving, positioning, regulating, pumping, and filtering, thereby controlling the environment for some desired outcome or purpose.

While this is the future trend of MEMS and NEMS technology, the present state-of-the-art is considerably more modest and usually involves a single discrete transducer element that is rarely integrated with microelectronics. Some notable exceptions are the inertial (accelerometers) sensors used for automotive markets as crash airbag sensors and the micro-actuator optical display technologies, which have gained market acceptance in television displays and projectors. However, in both cases, the manufacturers of these MEMS technologies struggled to successfully integrate MEMS with microelectronics, resorted to using existing in-house microelectronics capabilities, and were pursuing relatively high volume MEMS markets. Typically even the most advanced development programs seldom attempt to integrate the MEMS with microelectronics. Most often new development programs are focused on developing new and revolutionary discrete non-integrated MEMS devices. Nevertheless, MEMS technology is transitioning from the realm of device research to that of systems integration, which is necessary for this technology to be truly useful for most applications. Presently, the approach taken for system integration is to use a hybrid package assembly whereby a MEMS die is co-located with a microelectronics die. For some applications, particularly those where system performance is not critical, this may be the best approach. But for many applications where high performance is critically important, size and power consumption must be minimized, and reliability must be exceptional, system integration necessitates that the MEMS be co-located with integrated circuits.

Many technologies, including, but not limited to, microelectronics, MEMS, NEMS, photonics, nanotechnology, employ thin film deposition as an integral part of the fabrication process, particularly technologies that use micro- and nano-fabrication techniques in their implementation. For example, many MEMS and NEMS devices, particularly those made using a category of fabrication called "surface micromachining," use one or more deposited thin films as the structural or active layer of the device. As a result, thin films are used where the properties, particularly mechanical properties, of the materials matter the most. For many MEMS and NEMS devices having a mechanical functionality, perhaps the most important material properties are the residual stress and stress gradient. Importantly, the stress state of MEMS and NEMS structural layers will have a huge impact on the resultant device's behavior and performance, and as such, should be accurately known and well controlled in device implementation. Ideally, these material properties should also be able to be tailored, or adjustable, over a range of values specific to the device performance and application requirements.

Currently used thin film deposition techniques almost always introduce significant residual stress and stress gradients in thin film layers. Moreover, using existing deposition techniques, the stress state has typically been difficult to either predict or control, especially in devices made from multilayer thin film structures.

Present understanding of the relationship between states of residual stress and the processing conditions through which thin films are deposited is typically very poor and at best highly qualitative. Consequently, it is extremely difficult to design and fabricate devices if the mechanical properties of the materials used are not known, able to be controlled, and cannot be deposited reproducibly.

Furthermore, uncontrolled residual stresses can induce a variety of highly undesirable consequences, and include, but are not limited to, cracking, delamination, deformation, and microstructural changes in the materials. The need to ensure thin film mechanical integrity through controlled stress states continues to be a technology limiting factor for the implementation of MEMS, NEMS and other devices and is not merely limited to applications where load carrying capacity is the sole function.

Another limitation of deposited thin films for use in micro- and nano-fabrication is that they are often too thin for many device applications, particularly those in MEMS technology applications. MEMS devices often require very high aspect ratios and thicker films in order to meet specific device performance requirements. Unfortunately, the high stress states of many deposited material layers preclude the deposition of thicker film layers (e.g., not more than 1 to 2 microns for some materials and not more than a few thousand Angstroms for some others). Adequate control of thin film stress in situ can remove these thickness limitations and allow extremely thick films, even layers more than 100 μm in thickness, to be deposited. Additionally, stress-related adhesion issues that currently plague certain useful materials (i.e., Pt, Ni, Mo, $MgF_2$) may be overcome by stress-minimization and enhanced adhesion from increased energy transfer during initial the stages of film growth.

Currently, there is extremely limited ability to control the stress states of deposited thin films and this is a severe challenge for micro- and nano-fabrication technologies. As a result, device development is more costly and time consuming, production yields are lower resulting in higher manufacturing costs, and the performance of devices will be limited. It also limits the thickness of the layers that can be deposited, thereby restricting the design and process freedom for device implementation.

There is a need for improved methods for the deposition of material layers wherein the stress can be tailored to the specific device design and application. The benefits of controlling the stress in deposited thin films for micro- and nano-device fabrication is truly enormous. The ability to make thin films having predictable, controlled and reproducible stress levels allows device designs to be implemented much faster and more inexpensively. Further, it will allow thicker films made by PVD deposition techniques, thereby providing far greater design latitude. Thin film stress control makes possible a near-zero stress film or stack of films, which is extremely useful for most micro- and nano-device applications. In short, deterministic stress control of deposited films is truly a useful and much needed technology development.

There is a need to be able to fabricate MEMS and NEMS on a substrate that has had previous microelectronics processing performed on it, such as CMOS processing, and it is desired to perform further processing on the microelectronics wafer to enhance the devices or add new devices, such as MEMS or NEMS devices, so as to integrate the MEMS or NEMS with electronics onto the same substrate. The temperature of substrates with pre-existing microelectronics will have a temperature constraint placed on them whereby the substrates cannot be exposed to temperatures above 400 to 450 C for any significant amount of time, typically only a few minutes, before the pre-existing microelectronics have been degraded. There is a need for the fabrication of integrated MEMS and NEMS to obtain a low stress deposition at a sufficiently low deposition temperature for various thin films for the fabrication of MEMS and NEMS devices directly onto the substrate with pre-existing microelectronics.

Current thin film deposition techniques used in micro- and nano-fabrication are open-loop systems. That is, there is no mechanism for determining material properties until after the deposition is completed and measurements are subsequently taken on the sample. Closed-loop feedback control of thin film deposition would provide in situ stress control, as well as repeatability and consistency of the material that was deposited. Pressure and deposition rate monitoring are commonly equipped on deposition systems and utilized during thin film deposition, while stress measuring is absent. While thorough process development and frequent post-deposition characterization will initially produce stress-controlled thin films, the degree of control is less than that obtained with in situ monitoring. Additionally, closed-loop feedback stress control is immune to deposition and hardware drift, as it compensates the processing parameters in real-time. Therefore, closed-loop control of the stress in thin film deposition would be a useful invention.

SUMMARY OF INVENTION

The present invention is directed to a method and system for controlling the state of stress in deposited thin films on microelectronics wafers for the integration of MEMS and NEMS devices with microelectronics. This invention has application in microelectronics, nanoelectronics, micro-electro-mechanical systems (MEMS), nano-electro-mechanical systems (NEMS), photonics, and in other fields of endeavor that employ deposited thin films using physical vapor deposition (PVD) to implement integrated devices and structures.

The present invention allows tailorable, controlled, and reproducible stress states in thin films. The methods of the present invention can be applied to almost any known type and class of material that can be deposited by means of physical vapor deposition (PVD), which includes nearly all of the possible inorganic material choices for micro- and nano-device implementation. Specifically, the use of ion bombardment during deposition can achieve the goal of enabling control of the stress state of deposited films. Control over the deposition rate and pressure enable a further level of control over the resulting film stress-state to greatly enhance the design potential of micro- and nano-devices. Closed-loop control, whereby the stress of the film is able to be measured during deposition and the process parameters varied so as to obtain a pre-determined state of stress, is part of the present invention.

It is important to note that the present invention allows the temperature of the deposition to be constrained to some pre-determined level and the other process parameters adjusted accordingly to obtain a pre-determined and desired stress state in the deposited thin film. For example, many micro- and nano-fabrication process sequences require that the substrate undergo all processing below some threshold temperature so as to prevent damage or degradation of the material and/or devices already on the substrate sample. A representative example is a substrate that has had previous microelectronics processing performed on it, such as CMOS processing, and it is desired to perform further processing on the wafer to enhance the devices or add new devices, such as MEMS or NEMS devices, so as to integrate the MEMS or NEMS with electronics onto the same substrate. The temperature of substrates with pre-existing microelectronics will have a temperature constraint placed on them, whereby the substrates cannot be exposed to temperatures above 400 to 450 C for any significant amount of time, typically only a few minutes, before the pre-existing microelectronics have been degraded. This present invention can be used to obtain a low stress deposition at a sufficiently low deposition temperature for various thin films for the fabrication of MEMS and NEMS devices directly onto the substrate with pre-existing microelectronics.

The present invention allows improved device performance levels to be obtained, greater device design freedom, lower development costs and time, and higher production yields with lower manufacturing costs.

DETAILED DESCRIPTION OF THE INVENTION

Figure 1:
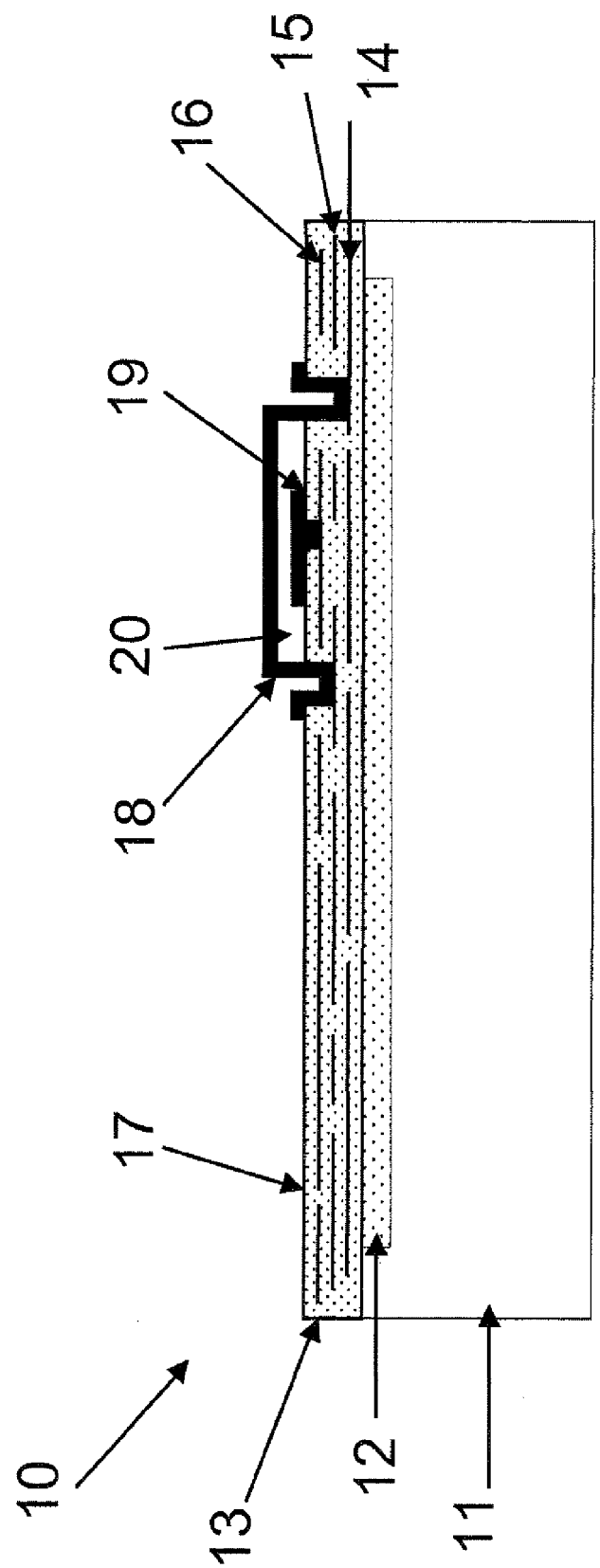
FIG. 1 is an illustration of an integrated MEMS technology platform.

The major factors driving the integration of MEMS/NEMS with microelectronics are performance and cost. From the perspective of performance, merging electronics and MEMS/NEMS has some distinct advantages compared to having MEMS/NEMS and the electronics on separate die, that is the so-called "hybrid" approach. Integration greatly reduces parasitics, which are extremely important in capacitive-based sensors, such as accelerators, gyroscopes, microphones, etc. Also, the power consumption of integrated MEMS/NEMS devices is much lower compared to non-integrated, or hybrid schemes, which is particularly important for certain military applications, such as unattended ground sensors, handheld sensors, and many others.

Additionally, the noise level problems in integrated MEMS/NEMS are usually lessened. This is because small signals, such as present in capacitive-based MEMS/NEMS sensors, are more immune from background noise sources when the electronics are co-located with the MEMS/NEMS devices. Having the MEMS/NEMS and microelectronic circuits on separate die has a higher value of resistance of the interconnects, bond pads, and bond wires and this combined with the parasitic capacitances collectively attenuate the electronic signal and contribute significantly to a higher noise level. Small signals, which are typical in MEMS/NEMS sensors, especially capacitive-based sensors, in the presence of high levels of noise are best managed with a minimum of unknown variables that may be caused by electromagnetic interference, parasitic capacitive coupling, mechanical stresses, and electrical leakage currents.

In general, the lower packaging complexity of an integrated MEMS/NEMS will have a higher reliability than a hybrid approach, which is also very important for certain applications. Integrating MEMS/NEMS with the microelectronics puts them both in the same thermal environment, thereby resulting in less thermal hysteresis. Furthermore, the additional resistance of a hybrid two-die approach combined with the parasitic capacitances also causes a signal timing delay due to the RC time constant, which also degrades system performance.

In applications where large arrays of MEMS/NEMS sensors or actuators must be individually addressed or actuated, size constraints and interconnection densities usually also demand integration. An example of this is the micro-actuator MEMS display technology that has over 1 million square mirrors, each having edge length dimension of less than 20 microns with above a 95% fill factor, and where every mirror in the array must be independently controlled. The wiring complexity and density of a device such as this precludes having the MEMS mirrors on one die and the integrated microelectronics on another die.

System size may also necessitate integration where the thickness or width must be kept below a certain dimension to meet the system level packaging requirements. This would be the case for a hand-held or unattended ground sensor application. Hybrid approaches require larger signals, more silicon area, and more power. Frequently, these approaches also require a suite of sensors to monitor the environment and compensate the MEMS/NEMS element adding cost, complexity, and potential reliability problems. As an example of the signal level differences required between an integrated MEMS sensors and a hybrid device, it was found the signal level for the non-integrated MEMS device needed to be two orders of magnitude larger than a signal level for an integrated MEMS sensor of the same type and design. Moreover, the MEMS silicon sensor size needed to be as much as 1000 times larger to create equivalent signal-to-noise levels.

From the economic perspective, the improvements in performance derived from integration afford higher yields and die density, and therefore, enable lower cost levels. The reduced assembly and packaging complexity of a single integrated chip solution, due to a reduced number of wirebonds for example, also translates into lower cost compared to a hybrid two-die approach. Additionally, an integrated MEMS/NEMS device will likely have a smaller silicon footprint and thereby lower costs as well. In short, there are a number of very substantive reasons why integrated MEMS/NEMS have many benefits in higher performance and reliability as well as lower cost compared to a hybrid approach. These benefits are critically important for many applications.

Presently, there are three basic ways in which microelectronics and MEMS processes can be integrated onto a common silicon substrate: (1) Fabricate the CMOS first and then fabricate the MEMS, which is the so-called "MEMS last" approach; (2) Fabricate the "MEMS first" and then fabricate the CMOS; or (3) Interleave the process flow for the MEMS and microelectronics together. Although NEMS have not advanced to the point, whereby they are integrated with electronics, it is expected that integration of NEMS with electronics will be very similar as to that of MEMS technology.

The "CMOS first" or "MEMS last" approach usually starts with a commercially produced CMOS wafer. It is then "post-processed" to produce the MEMS devices. The benefits of this approach are that the CMOS can be made cheaply in a commercial foundry that uses the most up-to-date CMOS process technology, and it also allows the MEMS device to be fabricated directly on top of CMOS circuitry. The main drawback is that this approach can restrict the MEMS processing to materials and thermal cycles that are consistent with the already completed CMOS circuitry, Other challenges with this approach are the ability to control the stress levels in the MEMS structures, to lithographically align the MEMS to the underlying CMOS circuitry with high accuracy, and the ability to make electrical connections from the microelectronics to the MEMS devices.

The MEMS first approach allows much more flexibility in the MEMS process flow than the alternatives for an integrated MEMS process sequence. However, it then requires a circuit process to be performed on a pre-processed and potentially non-flat wafer. Such a process often requires physical partitioning of the MEMS and circuit areas and methods such as CMP to provide a uniform flat area for circuit processing. It also requires that the MEMS materials used and the wafer cleanliness be consistent with introduction into a circuitry line. As a general rule, the MEMS first approach cannot access microelectronics from a state-of-the-art commercial foundry, since these facilities will not allow pre-processed wafers to be introduced into their production lines.

An interleaved integration process is one where the processing steps for making the MEMS are interleaved with the processing steps used to make the microelectronics. This is the most complicated approach, but also has the benefit of the greatest level of process flexibility and performance. The process can be intricately tailored to the specific needs of the device to be constructed. This approach can lead to the most efficient process solution and the smallest system footprint. However, this approach has the highest likelihood of unforeseen process interactions. Additionally, similar to the MEMS first approach, interleaved integration will not be able to access microelectronics at a commercial foundry as a general rule.

In short, only the "CMOS first" or "MEMS last" approach allows integration of the MEMS or NEMS devices with the most advanced commercially produced microelectronics technology. The main drawbacks of this approach, whereby the MEMS processing is limited to materials and thermal cycles that are consistent with the already completed CMOS circuitry and the ability to control the stress levels in the MEMS structures are overcome using the present invention. Importantly, the present invention can be implemented with any of these integration approaches.

It is well understood that the properties of the materials used in micro- and nano-fabrication, particularly the mechanical properties for MEMS and NEMS, have an enormous impact on device behavior and performance. It is well known in microelectronics fabrication that the electrical properties of the materials used must be very well controlled to achieve good transistor device performance. However, in order to achieve good performance in micro- and nano-devices for many technologies such as MEMS, NEMS, etc., mechanical as well as electrical, and potentially other material properties (e.g., optical, thermal, etc.) must also be very tightly controlled. This can be particularly challenging for thin-film materials used in micro- and nano-fabrication since these materials will typically possess a range of values in the "as deposited state" depending on the exact processing conditions (i.e., deposition rate, temperature, etc.) used during the deposition of the thin-film material.

Presently, device designers and developers usually have no choice but to develop device designs without a priori knowledge of the properties of the materials used to implement the device. This is especially true for deposited thin films, since these types of materials tend to have the most variability. Consequently, for a thin-film layer used in a device in the "as-deposited" state, the properties of that material layer would not be known until they are measured.

Because of the lack of material property information, device development typically entails a considerable amount of trail and error in developing a device design and process sequence that provides an acceptable yield. Indeed, since the material properties have such a large impact on device behavior designers, developers are not able to predict the outcome of process sequences, that is, whether the initial process runs will yield any working devices. Instead, they usually rely on their experience and judgment to formulate a strategy, based on the principles of design of experiments (DOE) to characterize and optimize the material layers employed. As part of this, they will create designs for test structures that will be useful for measuring the properties of the materials used in the process sequence. Models for the properties of these materials are extremely useful in this regard; however, any of the design models, whether analytical or numerical, initially will not likely be based on accurate values for the material properties. Therefore, at the start of a micro- and nano-device development effort, the designers will need to make reasonable estimates of these values in their design, with the goal of "bounding the problem." Device designers and developers typically create an initial design having considerable variation in the dimensions of the devices' critical components as well as material property test structures. These test structures, although highly imperfect in practice, allow the collection of some measurement data of the important material properties, such as the residual stress of surface micromachined structural layers.

With the designs in hand, along with a set of planned process experiments, the work in the fabrication laboratory begins to develop the processing steps and ultimately the sequence. Much of this work is iterative at many levels. The development of process steps varies the processing parameters over a set of reasonable values, followed by measurement of the outcomes, which are then documented and statistically analyzed. Once parts of the process sequence are beginning to mature, test structures will be fabricated and measurements taken to determine accurate dimensions and the material property values. These values will be fed back into the design models and new models will be created. Once the process sequence starts to come together and working devices are beginning to be yielded from the runs, the design and models are further refined, new mask sets are created and the iterations continue. It is reasonable to expect that the first two or more cycles of a new and customized process sequence may not initially yield any working devices. It is also reasonable to expect that once working devices are beginning to be yielded on the runs, that the yields will be below 25%, although higher yields are possible. Obviously, the cost and development time are heavily influenced by the complexity of the process sequence for any device type. For example, it is not uncommon to see very large development costs (e.g., in excess of $50M) for MEMS devices.

In short, the inability to have known and reproducible material properties is a major cause of the high cost and long time for micro- and nano-device development and can also make device development an unattractive business risk. Typically, it takes on average between 8 and 12+ years to take a concept and develop it into a marketable product and more than $50M in development costs. One of the primary reasons for the long time and high cost of micro- and nano-device development is the inability for developers to design devices with knowledge of the material properties. This would be analogous to a civil engineer having to design a skyscraper without knowing the properties of the materials to be used in the building's construction. This is the problem currently faced by micro- and nano-device designers and developers.

Figure 2:
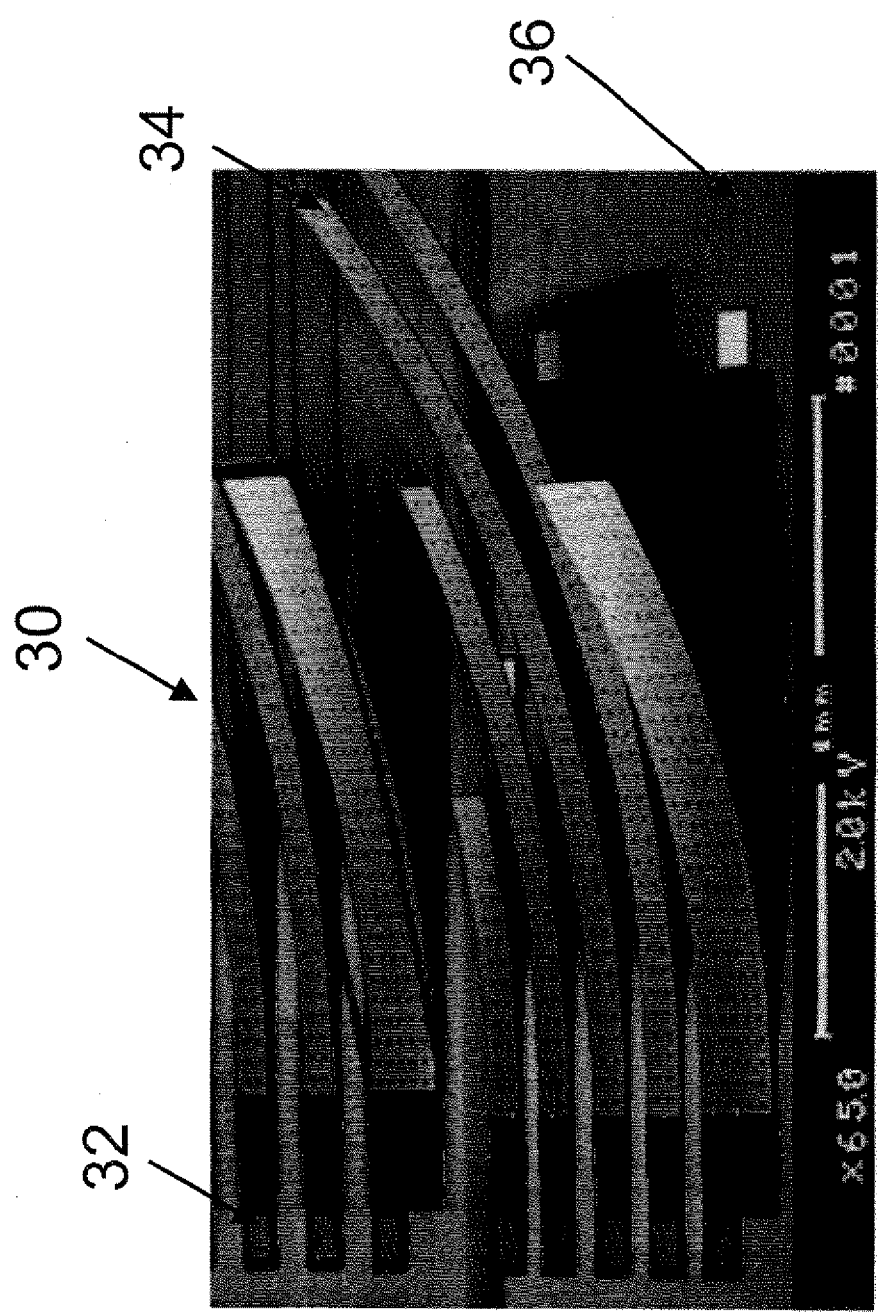
FIG. 2 is a photograph of some MEMS surface micromachined cantilevers, in which there is a stress gradient in the structural layer, as exhibited by the upward curling of the cantilever beam ends.

For example, FIG. 2 shows a photograph of some cantilevers fabricated on a substrate surface 30 using a process technology called "surface micromachining." This process technology entails the deposition of a thin film layer of a material that acts as a sacrificial layer. In the case, of FIG. 2, the sacrificial layer is a layer of silicon dioxide (SiO2). Subsequently, a structural or mechanical layer, which in this example, composed of polycrystalline silicon, is deposited as a thin film over the sacrificial layer. The structural layer then has photolithography and etching performed on it to pattern it into the desired shapes, which in this example are cantilevers 34 that are attached to the substrate at one end 32. Subsequently, the sacrificial layer is removed thereby releasing the structural layer from attachment to the substrate except only at the attachment point 32, which in FIG. 2 is at the left end of the cantilevers. The cantilevers 34 shown in FIG. 2 all have a curvature to them, whereby the right end lifts up from the substrate surface 36. This curvature is due to stresses in the structural material layer and these stresses are often very undesirable for device design.

Not knowing the material properties is obviously very problematic for device development. However, it also has serious repercussions for the deployment of micro- and nano-devices in real world applications. No matter that the intended application is for a thin film, when uncontrolled stress is present, it can cause a wide spectrum of problems and failures in the devices. Stress in thin films is invariably the leading source of device failure. Cracking, due to both tensile and compressive stress, is the major cause of these failures and is a problem found in every technique of physical vapor deposition (PVD). Of the most common PVD techniques, evaporation and sputtering can both suffer stress-related failures thin films deposited by these techniques, though they almost always differ in the inherent nature of the stress forces. Moreover, the reduction or elimination of a thin film's capacity to conduct electricity, elastically support a load, protect against corrosion, reflect or transmit light, a crack locally impairs a micro- or nano-devices' ability to function as designed. Additionally, once a crack forms, it often propagates, eventually resulting in a device becoming non-functional. Obviously, this has serious implications concerning device reliability. Therefore, it is critically important that material properties for micro- and nano-device development are better understood and methods for depositing thin film layers with known and controlled properties be developed and made available to device designers and developers.

Figure 3:
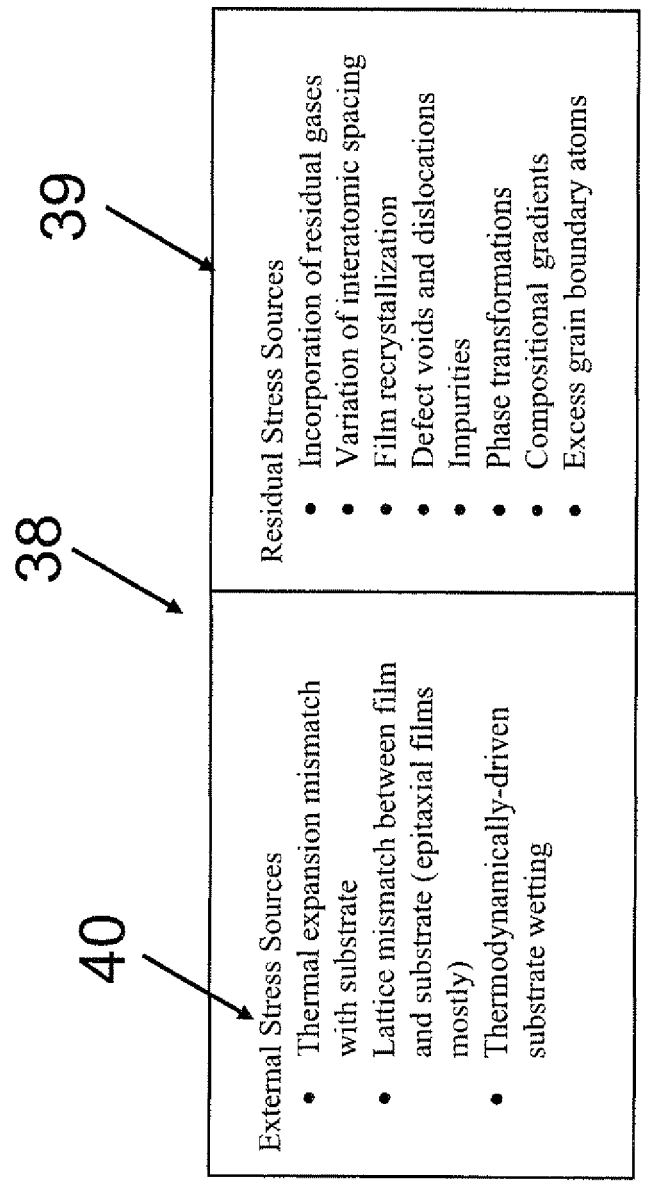
FIG. 3 is a table of the causes or sources of both external stresses and residual stresses in deposited thin films.

In considering the sources and causes of stress in thin films, the average stress in a thin film can be either zero, tensile, or compressive and with a magnitude over a very large range. The source of the stress found in thin films can originate from residual (internal) as well as result from external causes. The table 38 shown in FIG. 3 summarizes the leading sources of stress, both residual 39 and external 40. By definition, residual stresses 39 are the stresses that remain in a material after the original causes of the stresses (external forces 40, heat gradient) have been removed. These residual stresses 39 remain along a cross section of the material component, even without the external cause. Residual stresses 39 occur for a variety of reasons, including inelastic deformations and heat treatment. On a size scale equal to the thin film thickness, virtually any thin film deposited on a substrate possesses some state of stress distribution.

External sources 40 are dominated by the thermal expansion mismatch between the substrate and film material. Further compounding this stress source is the fact that the same material can have varying thermal expansion based upon its structure. Remarkably, this can even make the deposition of a thin film upon a substrate of the same material problematic.

Lattice mismatch and thermodynamically-driven wetting are similar in that they affect the structure and stress-state at the substrate-film interface. A stress field is generated by a lattice mismatch (either tensile or compressive) and is mostly found in epitaxial film growth, conditions not readily found in common PVD techniques, such as sputtering or evaporation. To a greater degree, varying levels of stress are formed by interfacial forces, which depend on the chemical free-energy change per unit volume that drives the condensation reaction, and, will determine film structure at the interface. When interfacial forces make film wetting of a substrate favorable, a high nucleation rate encourages a fine-grained or amorphous structure and is associated with tensile stresses due to the large grain boundary surface area. Conversely, a coarse-grained structure develops from the low nucleation rate found when wetting is not favorable and produces a weak substrate-film interface in addition to compressive stresses from more than usual film densification. While the stress fields from lattice mismatch and structural effects from film wetting are present at the substrate-film interface, they do not propagate far into the thin film. The wetting behavior is important with respect to the overall film adhesion since this stress source can lead to defected and weak substrate-film interfaces.

Figure 4:
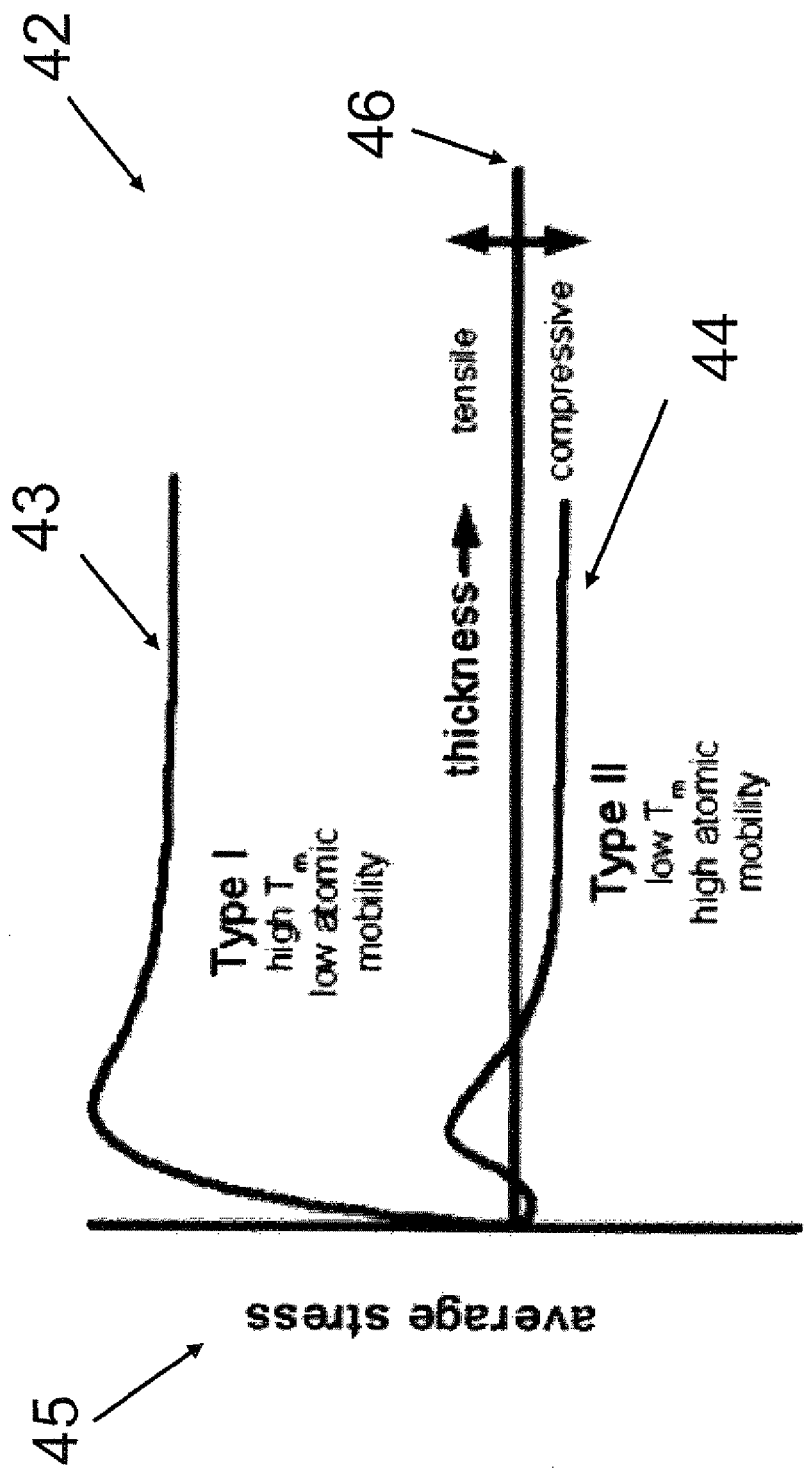
FIG. 4 is a plot of the average stress in a thin film as a function of the thickness of the thin film for both high and low mobility material and deposition conditions.

The common thread found with the sources of internal stress listed in the table 38 of FIG. 3 is the drive to reduce free energy, $\Delta G$. The particular thin film material's ability to reduce $\Delta G$ resides with its characteristic adatom mobility, which is dependent on material and amount of energy supplied to the growing film by the deposition method. The two ends of the mobility spectrum are classified as Type I shown as curve 43 in FIG. 4, and Type II shown as curve 44 in FIG. 4, whose characteristic average stresses, plotted on y-axis 45, are illustrated in the graph 42 in FIG. 4 as a function of film thickness, plotted on the x-axis 46. Evaporated films are typically Type I, corresponding to low mobility conditions and have associated tensile stresses. Where more energy is put into the growing film, Type II possesses enough energy for adatom surface diffusion to occur, and leads to compressive stresses primarily due to excess atoms in the grain boundaries. Ultimately, the average stress approaches a steady value for a fixed deposition rate of a given material system as shown in the graph 42 of FIG. 4.

Figure 5:
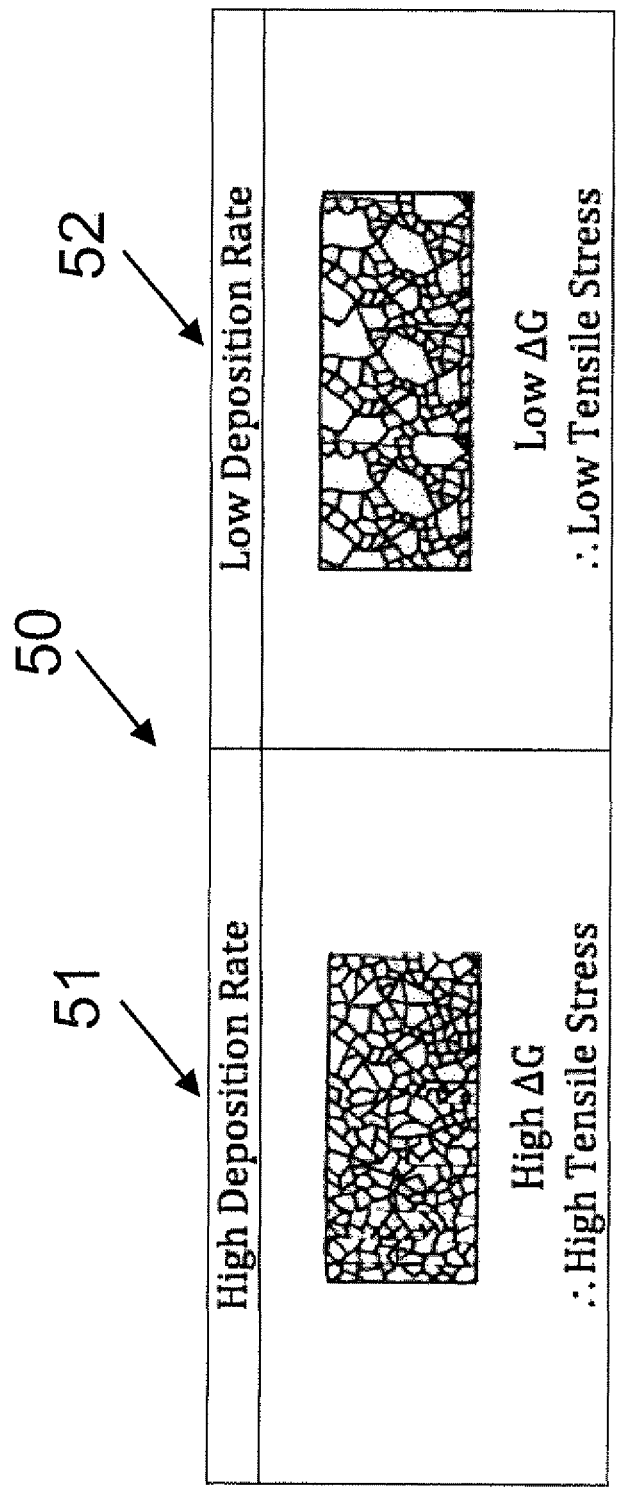
FIG. 5 is a table of thin film cross sections showing the resulting grain structure from both high and low deposition rates with accompanying free-energy AG.

Type I tensile stress (curve 43) arises from the formation of low mobility defects and either a large amount of grain boundary area or completely amorphous structure. At the initiation of film deposition, a high deposition rate mutes the nucleation and cluster growth, resulting in smaller, more densely populated film material nuclei on the substrate surface. The largely unordered film structure at the substrate interface leads to tensile forces stemming from larger than equilibrium interatomic spacings as the material "pulls" in on itself in an attempt to reduce the free energy of the system. Also occurring at high deposition rates 51, as shown in illustration 51 on the left side in the chart 50 of FIG. 5, the crystal grains (if not completely amorphous) are small owing to lack of energy and time needed for adatom surface and lattice diffusion to sufficiently grow the grains and lead to a large grain boundary surface area contained in the thin film. Grain boundary surface reduction mechanisms act across and "close" grain boundaries widths less than 1.7 Å and, again, "pull" the film in on itself and exhibit attractive (tensile) forces that are felt over grain boundary widths greater than 1.7 Å. Nuclei that form at the substrate surface tend to be larger and sparser due to coalescence, which results in less grain boundary surface area and, accordingly, less tensile stress as shown in illustration 52 on the right 52 side of FIG. 5.

The pressure at which film deposition occurs determines the stress of the growing film by increasing or decreasing the amount of kinetic energy imparted to it. Evaporated thin films typically operate at deposition pressures, P, in the $1 \times 10^{-4}$ Pa ($1 \times 10^{-6}$ Torr) range, Using an inert gas to increase P also increases the frequency of gas phase collisions, reducing the kinetic energy of the arriving molecules at the growing film surface. Using the mean distance traveled by molecules between successive collisions, the mean free path λ, as calculated by $$\lambda = \frac{RT}{\sqrt{2} \pi d^2 N_A P}$$

can predict the number of collisions that occur on average as the evaporated material moves from the source to the substrate. A high P increases the number of collisions, which results in defects and film structures that generate tensile stress. Low enough pressures at which zero collisions occur transfer the most kinetic energy and reduce the frequency and magnitude of tensile stress sources.

Figure 6:
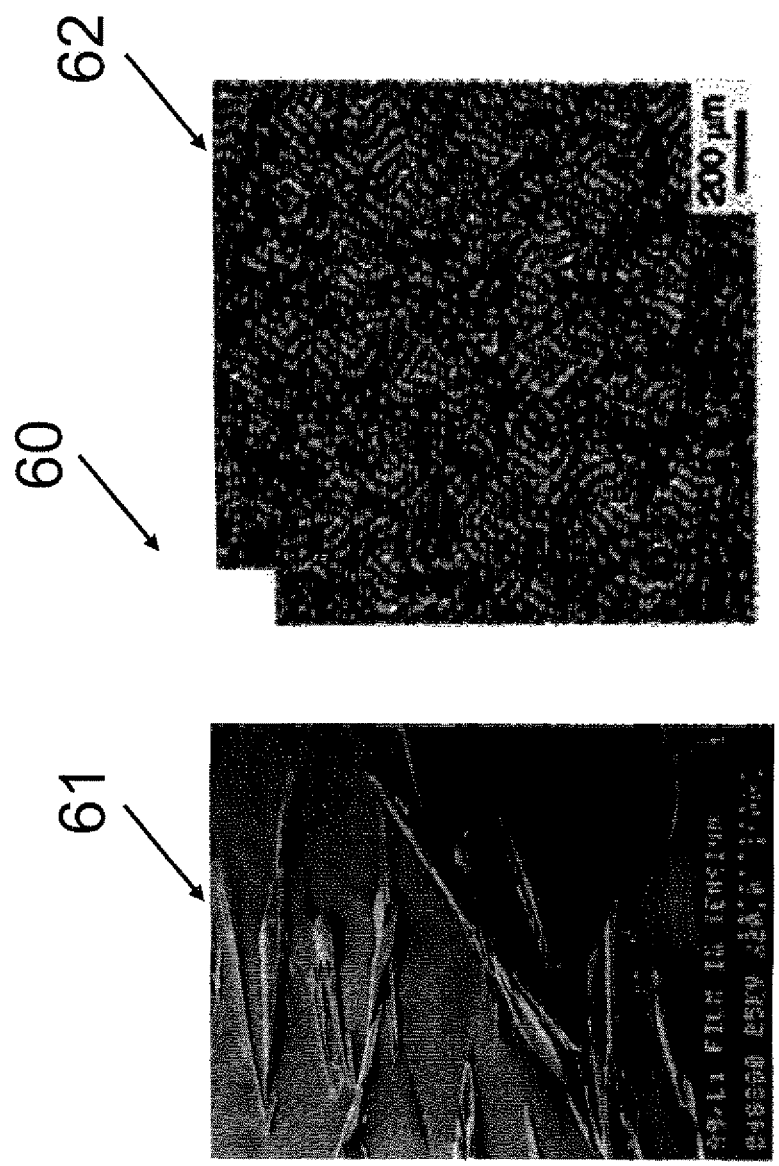
FIG. 6 is Scanning Electron Microscope (SEM) images displaying examples of thin film failure for tensile cracking on the left and compressive delamination on the right.

Excessive stress levels in thin films often result in failure. The photographs 60 of FIG. 6 show examples of both tensile 61 and compressive thin film 62 failure. Of the two commonly used PVD techniques, sputtering typically produces thin films with compressive stresses, while evaporation usually results in tensile thin film stresses. If a large enough compressive stress is present, it can cause cracking from buckling or "bubbling" of the thin film and is a result of the thin film pushing outwards, but being restrained by the substrate as shown in photograph 62 of FIG. 6. Tensile stresses lead to the film pulling in on itself, translating into the formation of cracks at defect sites or substrate cracking near the coating and the opening of these cracks, which results in further propagation as shown in photograph 61 of FIG. 6.

The fracture mechanics of thin films are often significantly different from bulk material behavior. The crucial factors that determine the type of failure depend on the thin film material, thickness, deposition parameters, and post-deposition treatment and aging. When the thin film consists of multiple layers, the number of parameters significantly increases, as does the complexity of the material interactions, Importantly, thin film failure occurs when it is energetically favorable for it to relax strain energy through plastic deformation (i.e., crack formation and/or delamination).

The adatom surface diffusion, desorption, and atomic bulk diffusion are processes that possess diffusion and sublimation activation energies. The activation energies scale with the relationship of the particular material's melting temperature. Therefore the most commonly used solution to the problem of non-equilibrium structures that cause stress in thin films is to perform thermal annealing. Therefore, high temperature thermal anneals is something that is routinely performed in micro- and nano-fabrication for many of the commonly used deposited materials (e.g., polycrystalline silicon); but this approach has significant limitations and disadvantages. One major limitation is that most materials have very high melting temperatures, which rule out thermal annealing to minimize film stress or eliminate film stress in a large number of commonly used materials in micro- and nano-fabrication (at least at reasonable temperatures). Additionally, thermal annealing as a method of stress management is not a viable option for the process sequences of many MEMS devices due to the fact that it alters and/or degrades other pre-existing materials on the substrate, as well as the resultant performance of the devices. Additionally, thermal anneals are not desirable, since they require an additional processing step after every deposition, thereby increasing the cycle time and cost of MEMS fabrication. What is needed is a method and system by which thin films can be deposited at lower temperatures without the need for a thermal anneal and where the stress of the thin film can be tailored to a desired and pre-determined value, either compressive, tensile, or zero state of stress.

The method of the present invention is applicable to any physical vapor deposition (PVD) process technology, including evaporation and sputtering.

Figure 7:
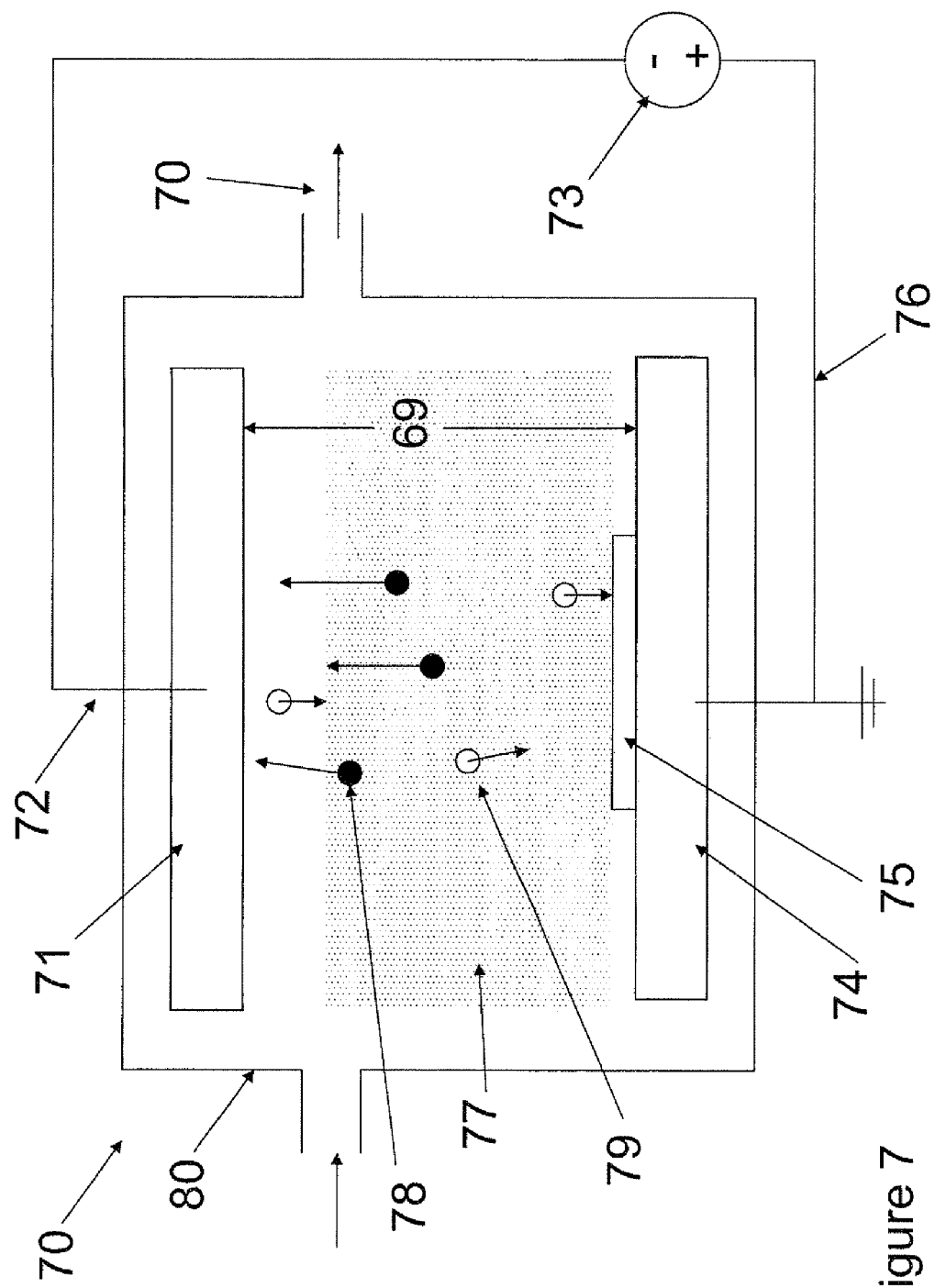
FIG. 7 is an illustration of a conventional sputter deposition system used for thin film sputter deposited PVD.

FIG. 7 illustrates a typical sputtering system 70 used for depositing thin films using this technique. The sputtering process takes place in a vacuum enclosure 80 with an input gas line 78 that feeds an inert gas, such as Argon, into the chamber 80. Vacuum is drawn in the chamber 80 through the connection 70 that is connected to a vacuum pump (not shown). A target 71 composed of the material to be deposited is affixed inside the chamber 80 and connected 72 to a power supply 73 wherein the negative potential is established in the target 71, which acts as the cathode. An anode 74 is located within a distance from the cathode 71 inside the chamber 80 and connected through an electrical connection 76 to the anode 74 and the positive side of the power supply 73. A substrate 75 is placed onto the anode 74. The inert gas stream incoming through the input port 78 into the chamber 80 is ionized and forms a plasma 77 between the anode 74 and cathode 71. Inert ions from the plasma 78 are accelerated toward the cathode 71 and impinge the cathode 71 and target material of the cathode with high energy, which results in target material 79 being ejected from the target 71 toward the substrate 75, thereby resulting in the deposition of a thin film of the target material 71 onto the substrate 75.

Figure 8:
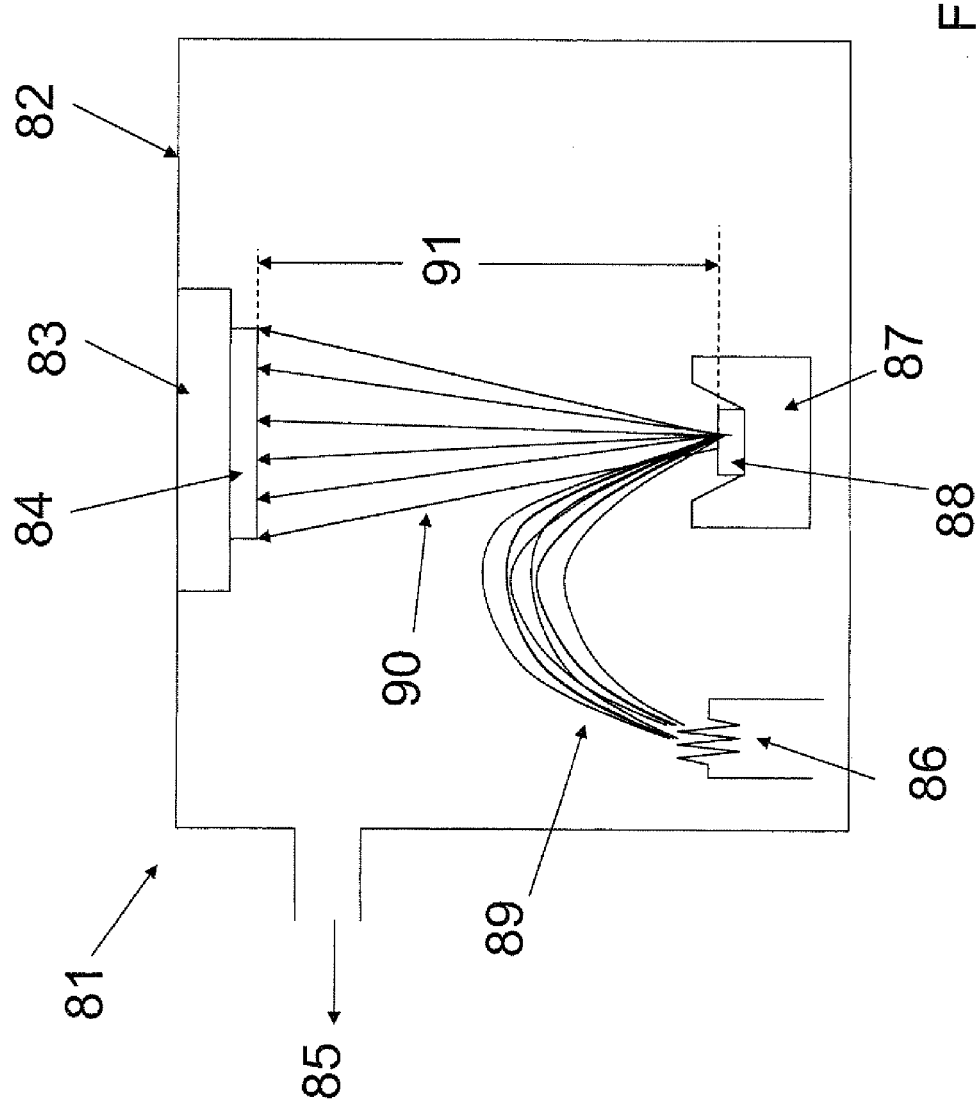
FIG. 8 is an illustration of a conventional evaporative deposition system used for thin film evaporative deposited PVD.

FIG. 8 illustrates a typical evaporation system 81 used for depositing thin films using this technique. The evaporation deposition process takes place in a vacuum enclosure 82 and vacuum is drawn in the chamber 82 using the connection 85 that is connected to a vacuum pump (not shown). A crucible 87 located in the chamber 82 contains a material 88 composed of the material to be deposited. An electron beam 89 is generated via an electron beam source 86, which is steered toward the target material 88 in the crucible 87 by the voltage potential on the crucible 87 (not shown). The impinging electron beam 89 onto the target material 88 in the crucible 87 causes the target material 88 to heat up and melt and thereby vaporize or evaporate and result in the target material 88 phase changing into a gas phase 90 which is deposited onto a substrate 84 as a thin film. The substrate 84 onto which the target material 88 is deposited is positioned onto a holder 83 inside the chamber 82, which is under vacuum pressure 85.

The method and system of the present invention of controlling the stress state in a thin film involves varying four process parameters during deposition. These are: deposition rate; process pressure; process temperature; and ion bombardment. These can be varied individually or in combination to obtain a pre-determined stress state in deposited thin films under the present invention.

The first method for controlling the stress is by varying the deposition rate. Through standard deposition rate controlled thin film growth, the rate of nucleation is altered. By lowering the deposition rate, energy is neither added nor removed from the growing film surface, as compared to higher deposition rates. The only factor that changes is the time that adatoms can diffuse to low energy sites before being covered and frozen in place by newly condensing material.

By altering the deposition rate, a degree of control is obtained over the residual stress. Aside from film stress, there are other effects that result from varying the deposition rate, such as substrate heating due to the cumulative duration of radiant source exposure and tool cost associated with time spent on thin film fabrication, both of which will be reduced for higher deposition rates. The deposition rate in a sputtering system, such as sputtering system 70, is generally varied by adjusting the voltage potential produced by a power supply, such as power supply 73 shown in FIG. 7. A higher voltage potential will result in a higher deposition rate and vice versa. The deposition rate in an evaporation system, such as evaporation system 81 shown in FIG. 8, is generally varied by adjusting the electron beam current associated with an electron beam, such as electron beam 89 from the electron beam source 86. A higher electron beam current will result in a higher deposition rate and vice versa.

Controlling thin film stress in deposited material layers by adjustment of the deposition rate can be done with any means of physical vapor deposition, including evaporation and sputtering.

A second method for controlling the stress is by varying the process pressure. The mean-free path, $\lambda$, used in combination with the source-substrate distance, $d_{ss}$, shown as item 69 in sputtering system 70 in FIG. 7 and as item 91 in evaporation system 81 in FIG. 8, provides a route to design zero or multiple collisions and engineer the degree of thermalization, which directly affects the amount of energy supplied to the adatoms at the film surface. By increasing the pressure, P such that $d_{ss} > \lambda$, not only reduces the kinetic energy transferred to the film, but also increases the degree of conformality obtained across substrate topography. Decreasing P so $d_{ss} < \lambda$ ensures the maximal kinetic energy is transferred and the deposition is line-of-sight from the target to the substrate. However, if kinetic energy is supplied to control stress by some other means, a high P can be used solely to introduce conformality to an evaporated film.

If a reactive gas, such as oxygen or nitrogen, as opposed to an inert gas, is used to backfill a chamber during deposition and increase P, some degree of stoichiometric control can also be introduced. Typically, deposited oxides are oxygen deficient due to oxygen loss to the chamber pumping system when evaporating an oxide source material or insufficient oxygen uptake when evaporating reactively from an elemental source material. By providing oxygen impingement at the growing film surface, an oxide thin film will be closer to stoichiometric with regard to oxygen content.

The third method of controlling stress in PVD deposited thin films is by varying the temperature. Typically, this is done using substrate heating or cooling, wherein the substrate that has the thin film deposited on the surface is located onto a chuck inside the deposition system and the chuck is heated or cooled using any number of means, including: heater coils; heating lamps; RF induction heating coils; temperature controlled fluids that run through the chuck; etc. In general, the higher the temperature, the more energy is available to the adatoms to find a lower energy state and thereby lower the stress levels.

A fourth and the most flexible method for controlling the stress is by using ion-assisted deposition (IAD). Ion-Assisted Deposition provides the most latitude and design freedom for controlling stress in deposited films. The basic concept is that an ion beam is directed toward the substrate surface during the deposition process of a thin film layer, wherein the energy of the impinging ions is able to modify the energy and thereby the stress in the layer during deposition.

Two main types of ion sources can be embodied and are categorized into gridded ion sources and gridless ion sources with either the end-Hall and anode-layer configuration.

Figure 9:
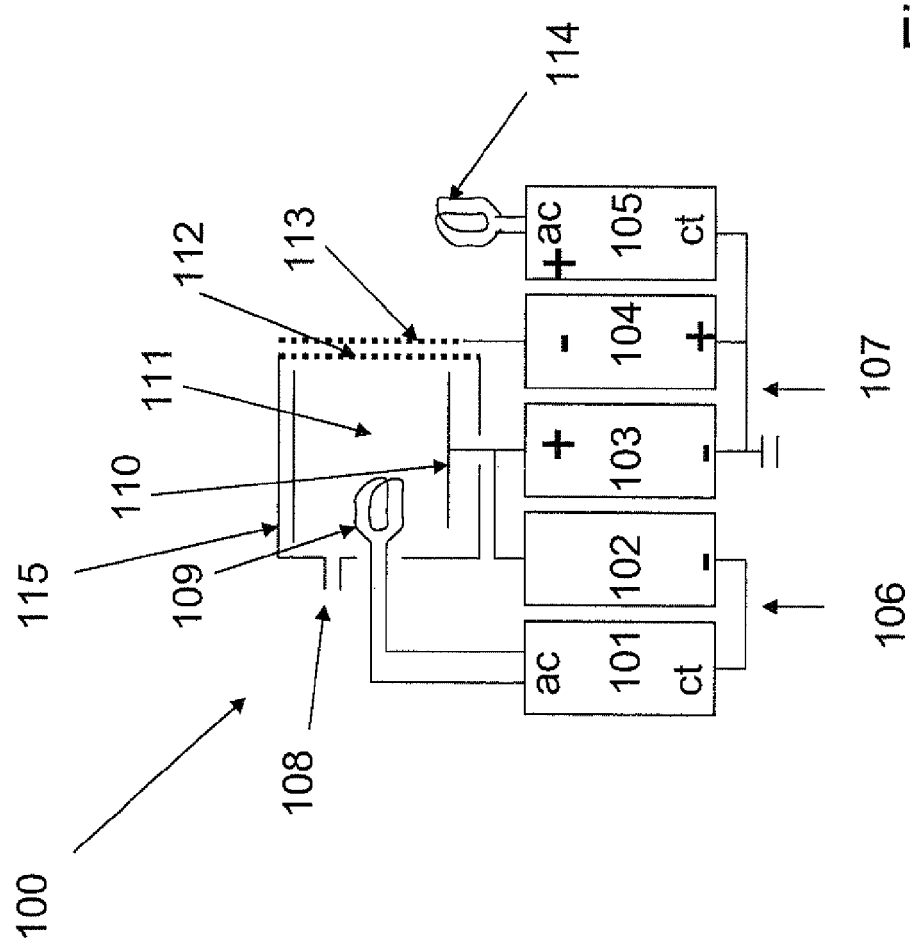
FIG. 9 is a schematic of a gridded ion source used for ion-assisted thin film deposition that allows stress control in the deposited thin films.

The preferred embodiment of a gridded ion source 100 is illustrated in FIG. 9. Gridded ion source 100 operates by generating ions in a circular or elongated DC-discharge chamber 115. Several types of electron-emitting cathodes 109 can be used, including hot-filament and hollow-cathode. The electron-emitting cathode 109 is connected to a cathode power supply 101 where an electrical connection 106 is made between the cathode supply 101 and the negative terminal on the discharge supply 102. The positive potential side of the discharge supply 102 is electrically connected to the anode 110 inside the chamber 115. The positive side of the discharge supply 102 is also electrically connected to the positive potential side of the beam supply 103, whose negative electrical potential side is connected, by a common connection 107 to the accelerator supply 104 and the neutralizer supply 105. The positive voltage potential side of the beam supply 103 is electrically connected to the anode 110. The negative potential side of the accelerator supply 104 is connected to the ion accelerator 113. The neutralizer supply 105 is electrically connected on the ac side to a neutralizer coil 114. It should be noted that the ions can also be generated with a radio-frequency (RF)-discharge, which requires no electron emitting cathode (not shown). The discharge chamber 115 is maintained at a positive potential that accelerates the ions in conjunction with and through apertures called ion optics. The ion optics are typically composed of two perforated grids, shown as screens 112 and 113 in FIG. 9, that can create ion beams with energies of more than 200-300 eV. A three-grid ion optics preferred embodiment (not shown) consists of three perforated grids. These systems provide a smaller divergence of ion beams with energy up to ~500 eV and decreases beam contamination resulting from sputtering of the accelerating grid by charge-exchange ions. Preferably, ion optics are employed to focus the beam to converge, collimate, or diverge, depending on how the grid's are powered.

Figure 10:
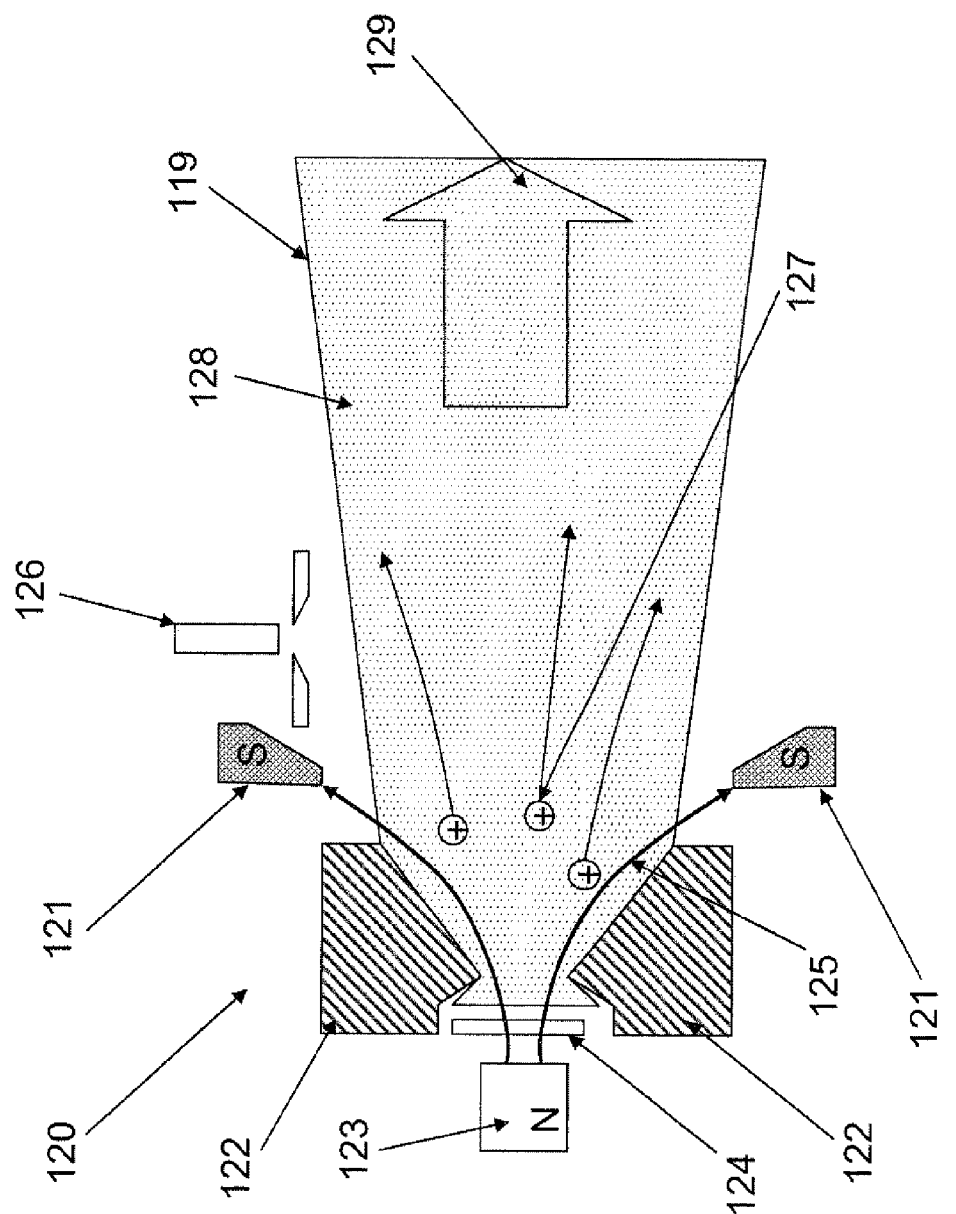
FIG. 10 is a schematic of a gridless end-Hall ion source used for ion-assisted thin film deposition that allows stress control in the deposited thin films.

The preferred embodiment for a gridless ion source can be either an end-Hall or anode-layer gridless source. The ions in a gridless source are generated by a discharge supply, with an accelerating potential difference produced by electrons from the cathode-neutralizer entering the magnetic field setup by permanent magnets in the source. The end-Hall ion source type 120 shown in FIG. 10 has a discharge chamber 119 where acceleration of ions takes place in a quasi-neutral plasma 128, with approximately equal densities of electrons and ions. Consequently there is no limitation on ion-beam current and the ion beam equals about 20-30% of the discharge current and the mean ion energy corresponds to about 60-70% of the discharge voltage. An end-Hall ion source 120 operates at a process pressure of 1 mTorr or less and has an end-hall anode 122 and an electron source cathode 126. Magnetic field lines 125 are established between the north side 123 and the south side 121 of a magnetic or electro-magnet. The gas to be ionized is input at 124 and ions 127 are generated in the chamber 119 to form a plasma 128 and a ion beam 129. This configuration of ion source can generate large ion-beam currents at ion energies in the 100-300 eV range, but cannot easily generate higher ion energies. The ion-beam profile is limited to a divergent shape, as shown in FIG. 10.

An anode-layer ion source (not shown) is also known as a closed-drift ion source, which refers to the electron's movement in a closed path around an annular- or "racetrack"-shaped discharge chamber. The anode-layer is a type of closed-drift source in which most of the acceleration takes place in a thin layer near the anode. The anode-layer type typically operates in the vacuum mode, characterized by the absence of a cathode neutralizer. The discharge voltage ranges from about 800-2000 V, noticeably higher than for an end-Hall ion source 120. This type of ion source operates at a background pressure of several mTorr or less. One major drawback originates from the fact that the ion beam potential must be elevated to obtain neutralizing electrons from the surroundings. This exposes the substrate to damaging high electric fields and high potentials for dielectric substrates or substrates with dielectric films.

Figure 11:
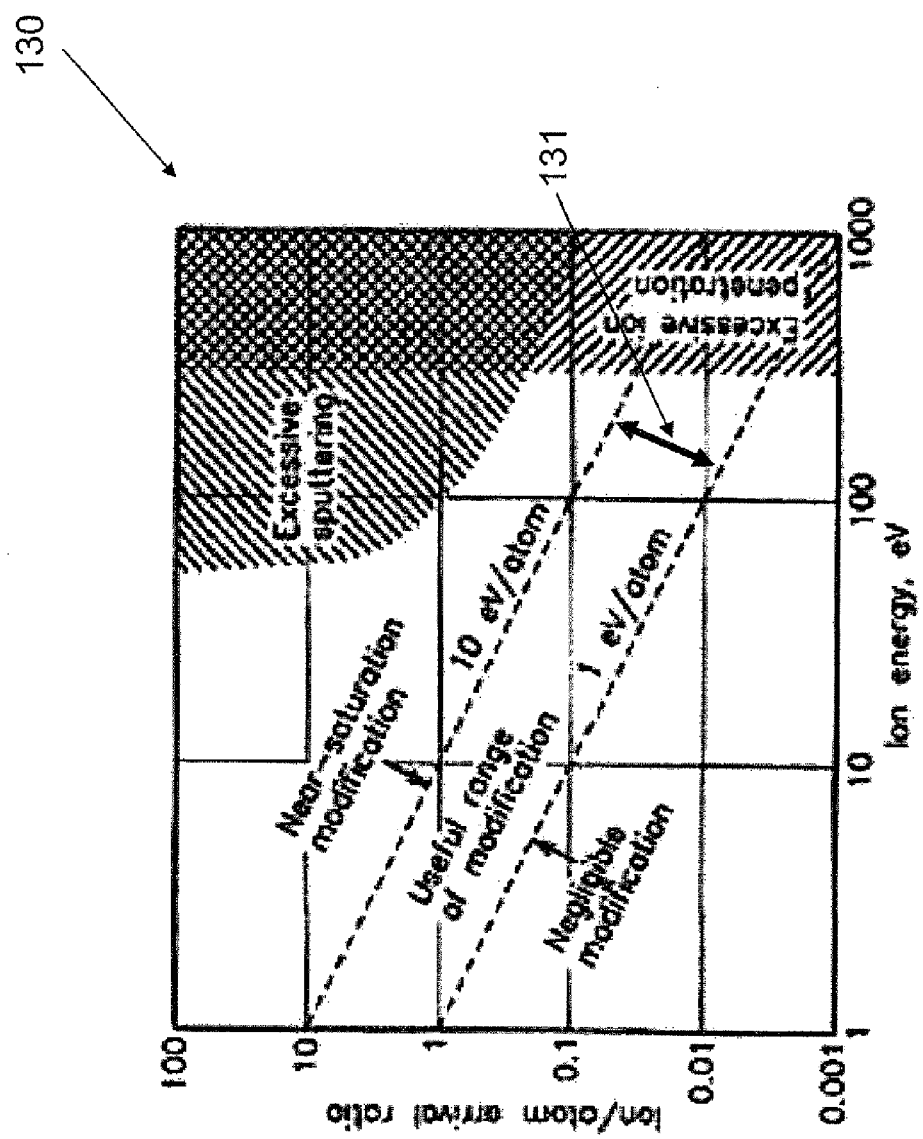
FIG. 11 is a plot of the necessary ion energy dose for thin film stress modification and control.

The ion source must be able to deliver the required level of ion beam current density at the substrate, which roughly equates to an arrival rate of one ion per atom of deposited material. Hence, the higher the deposition rate, the greater the ion current density required. However, the high ion current density also needs to be delivered at sufficiently low ion energies, since many materials will start to sputter (including chamber surfaces) as the ion energy approaches and exceeds 100 eV. This creates a potential contamination risk to the deposited film due to redeposition of back sputtered chamber components. For sufficiently high deposition rates, only the gridless end-Hall ion sources can put out the necessary combination of high ion current density and low ion energy required for film stress control. Kaufman and Harper identified a region between 1-10 eV/atom necessary for measurable control as seen in chart 130 of FIG. 11 wherein the range between 1 and 10 eV/atom 131 is shown on the chart 130. At low deposition rates, the gridded ion source is best fitted to control film stress, since the ion energy distribution is much narrower than found in gridless ion sources. Additionally, gridded ion sources can focus the beam, whereas gridless source beam's are solely divergent.

The addition of energy from bombarding atoms in the form of a beam of inert or reactive species can provide sufficient energy to adatoms to overcome the activation energy barriers to low energy sites. As the adatoms are able to diffuse into low energy sites, the residual stress moves initially from tension to compression (FIG. 4) for evaporated films. Care must be taken not to supply too much energy, such that the stress is pushed into compressive region. Fortunately, the amount of ion energy coming from an ion source can be designed to provide a specific level of energy that brings the average stress in the film to near-zero. Widening the process window further, use of inert gases in the ion source, such as helium, neon, argon, and xenon, have the ability to transfer differing amounts of energy to the growing film, while not contaminating the material. By varying the mass of the bombarding inert gas, the fraction of kinetic energy transferred between the inert gas ($m_2$) and the film ($m_1$) varies and is determined by $$\frac{KE_i - KE_f}{KE_i} = \frac{m_2}{m_1 + m_2}$$

Therefore, after consideration of the atomic mass of the thin film material(s), a corresponding inert gas, such as argon, is selected to provide a desired level of kinetic energy transfer to achieve specific atomic, nano-, microstructure at a particular pre-determined residual stress level.

The methods of the present invention of controlling the stress state in a thin film to a pre-determined near-zero value by varying one or more of the three important process parameters during deposition will now be described.

Varying the Pressure and Temperature of the PVD Process to Control Stress in Thin Films:

When stress in thin films is present and causes the intended behavior of a thin film to change, the systematic process of the present invention can be used to minimize the stress. The first two PVD variables that can be used to alter the stress in thin films are process pressure and substrate temperature and the methodology to arrive at a desired pre-determined stress level by varying only the temperature and/or pressure is outlined in the flow chart 140 of FIG. 12.

The changes in film stress when adjusting these PVD process variables also change the thin film morphology and conformality over the topology of the substrate. The thin film structure can change dramatically over the nano-, micro-, and macroscale by becoming more or less porous and crystalline. The conformality can change from line-of-sight to partially conformal while complete conformality is never possible in either evaporation or sputtering PVD techniques.

When thin film stress needs to be adjusted to return desired functionality to the thin film, the widest process window variable is the process pressure. The determination of whether the initial process pressure is "high" or "low" can be found by comparing two deposition tool parameters: the deposition material source to substrate distance ($D_{ss}$) and the mean free path of the gas-phase depositing material ($\lambda_{mfp}$). A pronounced affect on the thin film stress and conformality occurs when moving the $\lambda_{mfp}$ above or below the $D_{ss}$.

In the case where the thin film stress adjustment increases the tensile nature of the stress, the process pressure will be increased and is represented by moving toward or further into the $\lambda_{mfp} < D_{ss}$ range. When increasing the compressive stress, a decrease of the process pressure will be needed and is represented by moving toward or further into the $\lambda_{mfp} > D_{ss}$ range. The typical process pressure range is from $10^{-9}$ to $10^{-3}$ Torr. If the process pressure adjustment is successful in moving the thin film stress to zero, then no further adjustment is necessary.

If the process pressure window is not large enough and stress is still present or if the accompanying thin film morphology and/or conformality changes are not tolerable, the second of the PVD process variables can be adjusted. The sensitivity of thin film stress to substrate temperature is not as large as it is to process pressure, but there is still a large enough process window to change the film stress to a zero-point. Typical PVD depositions occur at room temperature (20° C.) and a realistic range extends from −100° C. to 800° C.

In the case where the thin film stress adjustment increases the tensile nature of the stress, the substrate temperature will be decreased (<20° C.). When increasing the compressive stress, the substrate temperature will be increased (>20° C.).

As with process pressure, the thin film morphology and conformality will be altered as the temperature changes. If the desired functionality of the thin film can be retained while an adjusted substrate temperature is used, then the realistic temperature range of −100° C. to 800° C. defines the process window for substrate temperature. Lower than room temperatures may be achieved through cooling of the substrate during deposition and is usually accomplished with liquid nitrogen or chilled water. Higher than room temperatures are achieved by heating the substrate with a resistive heater in contact with the substrate or by irradiation from a source (IR or visible wavelengths).

If the thin film and/or substrate cannot be adjusted for temperature and if the process pressure window could not adjust the thin film stress to a zero-point, then adjustment of the bombardment is necessary.

Figure 12:
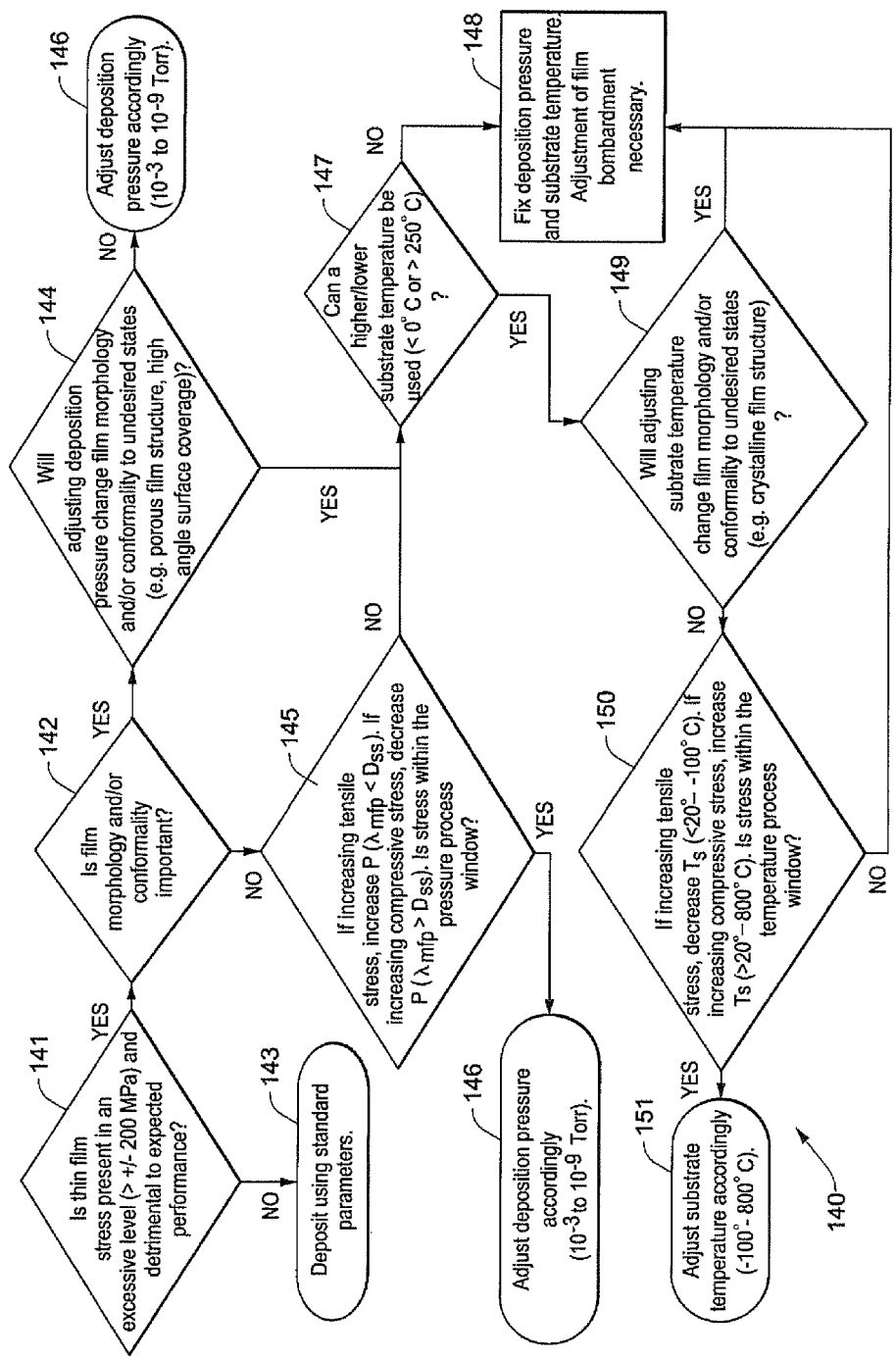
FIG. 12 is a flow chart diagram explaining the procedure to adjust the process pressure and substrate temperature for a PVD deposition process so as to control the stress in the deposited thin film. This flow chart can be used for both evaporation and sputtering PVD deposition processes.

Therefore, using the flow chart 140 of FIG. 12, it can be seen that the first decision point 141 is whether a thin film is known or expected to have an excessive stress level. If the film does not, then the thin film can be deposited using the standard process parameters at step 143. If the film does have excessive stress, then the next decision point 142 is whether the film morphology and/or conformality are important. If thin film morphology and/or conformality are important, then the next decision point 144 is whether adjusting the deposition pressure will change film morphology and/or conformality to an undesired level. If the answer to this decision point 144 is no, then the deposition pressure can be adjusted over the range from $10^{-3}$ to $10^{-9}$ torr to obtain the desired thin film stress level. If on the other hand at decision point 142, wherein the morphology and/or conformality are not important, the next decision point 145 is whether the stress can be controlled within the process pressure window. If it can, then the pressure is adjusted accordingly in step 146 over the range from $10^{-3}$ to $10^{-9}$ torr to the desired stress level.

If not, then a decision point 147 is used to determine whether a higher or lower substrate temperature during deposition can be used, wherein the lower temperature may be below 0 degrees C. and the higher temperature may be greater than 250 degrees C. If substrate temperature cannot be used, then the pressure and temperature are fixed and ion bombardment is used to control the stress level 148 (see below for how this method is performed). If the substrate temperature can be adjusted, the next decision point 149 is whether adjusting the substrate temperature will cause the thin film morphology and/or conformality to an undesired state or not. If the answer to this decision point 149 is yes, then ion bombardment must be used to control the stress level 148 (see below for how this method is performed). If the answer to this decision point 149 is no, then the next decision point 150 is if increasing the tensile stress by decreasing the substrate temperature or increasing the compressive stress by increasing the substrate temperature enables a stress within the temperature process window to be obtained or not. If not, then ion bombardment must be used to control the stress level 148 (see below for how this method is performed). If yes, then the substrate temperature is adjusted accordingly between the range from −100 C to +800 C at step 151.

The method of controlling stress in PVD deposited thin films described above can be used with either evaporation or sputtering means of deposition. If the method described above, wherein the pressure and temperature are varied, cannot be used to obtain the desired pre-determined stress level, then ion bombardment must be used and the methods of obtaining controlled stress in thin films is different for PVD deposition performed using evaporation and sputtering. These methods for controlling stress using ion bombardment are described below, first starting with evaporated PVD thin films and then sputtered PVD thin films.

Using Ion Bombardment to Control the Stress of Evaporated PVD Deposited Thin Films:

In the case where evaporation PVD process pressure ($10^{-9}$ to $10^{-3}$ Torr) and substrate temperature (−100° C. to 800° C.) have been explored and found not adequate in reducing the thin film stress as described in flow chart 140 of FIG. 12, adjustment of the bombardment from an ion source is necessary.

The ion source used in thin film stress modification are typically gridded or gridless ion sources of end-Hall Kaufmann, or anode-layer configurations as described above. The ion source variable parameter with the largest effect on film stress is the ion source current, which ranges from 1-12 A typically. The ion source current adjusts the dose of bombarding species onto the growing thin film. In the case where the thin film stress adjustment increases the tensile nature of the stress, the ion source current will be decreased (<2 A). When increasing the compressive stress, the ion source current will be increased (>2 A).

If the zero-point for the thin film stress falls outside the ion source current process window, the ion gun voltage provides an expansion to the overall process window for the ion source. The ion source voltage adjusts the energy with which the bombarding gas phase imparts to the growing thin film. In the case where the thin film stress adjustment increases the tensile nature of the stress, the ion source voltage will be decreased. This is typically <200 V but is heavily reliant on the type, size, and configuration of the particular ion source. When increasing the compressive stress, the ion source voltage will be increased to >200 V.

When the zero-point of the film stress cannot be dialed in using a fixed ion source current and variable ion source voltage, re-adjustment of the ion source current becomes necessary. An accompanying re-adjustment of the ion source voltage may be necessary to fine-tune the stress. Several iterations of this process may be necessary. If successful both the ion source current (1-12 A) and voltage (100-300 V) will be fixed and thin films of any thickness may be deposited at the zero-stress level. If unsuccessful, a re-adjustment of the process pressure and/or substrate temperature may be necessary since altering either of these process variables will shift the process window obtainable with the ion source. The adjustment process for the ion source current and voltage will begin anew at this point.

In the case where no set of evaporation process variables can be found that results in a zero-stress level, other PVD techniques must be explored.

Figure 13:
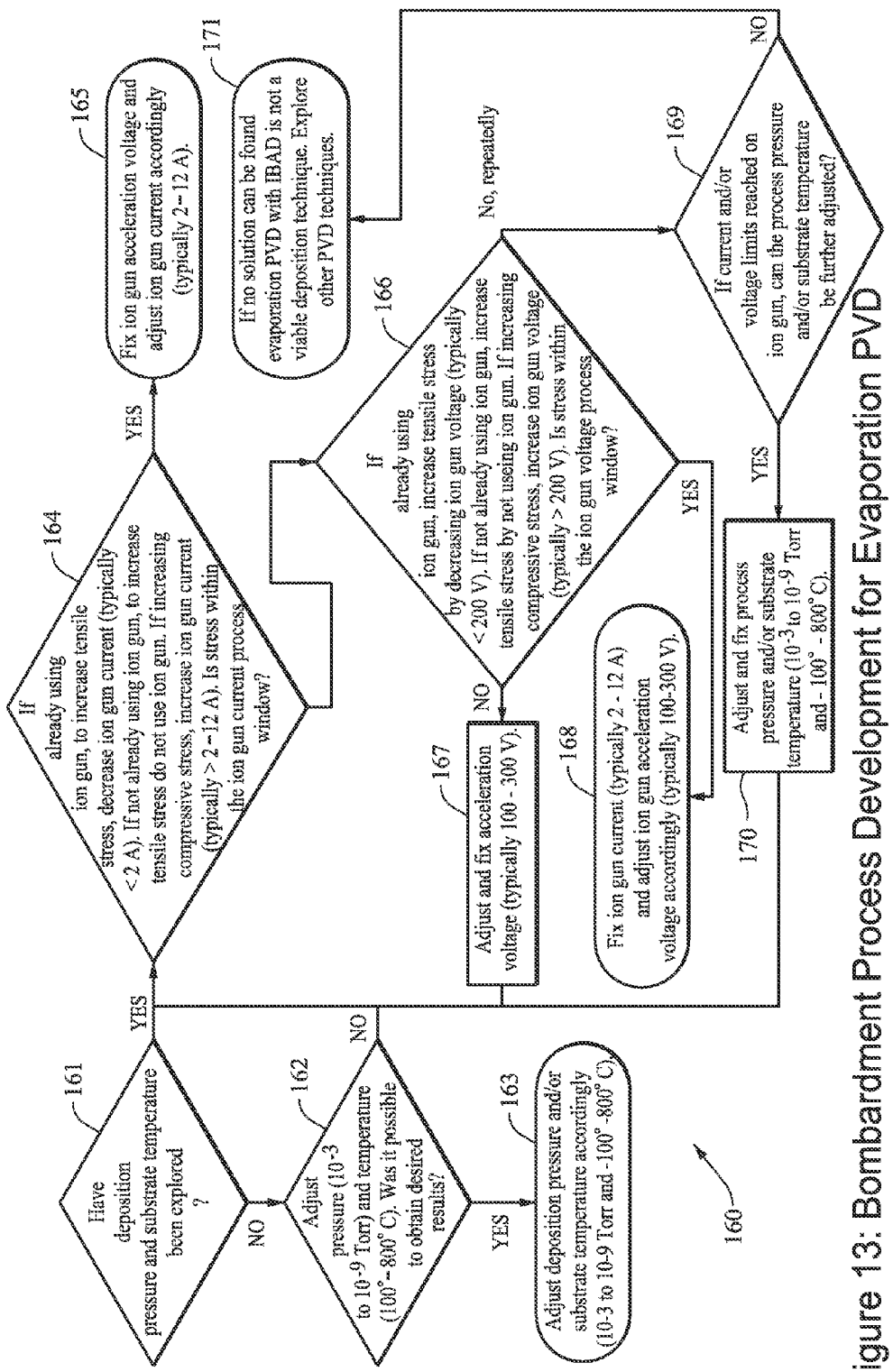
FIG. 13 is a flow chart diagram explaining the procedure to adjust the ion-beam parameters as well as process pressure and substrate temperature so as to control the stress in evaporated PVD deposited thin films.

The method of obtaining stress controlled evaporative PVD deposition of thin films is shown in the flow chart 160 of FIG. 13. The first decision point 161 is whether process pressure and temperature have been explored to control the stress. If the answer is no, then the next decision point 162 is whether the pressure can be varied from between $10^{-3}$ to $10^{-9}$ torr and the temperature varied between −100 C to 800 C to attempt to obtain the desired stress level in the deposited thin film. If the answer is yes, then the pressure and temperature can be varied accordingly to obtain the desired stress state in the thin film 163. If not, then ion bombardment during deposition must be explored thereby leading to the next decision point 164.

If on the other hand, pressure and temperature have been varied without the desired results, then the next decision point 164 is whether the stress in the thin film is within the ion gun current process window or not. If the answer is yes, then the gun acceleration voltage is fixed and the ion current is adjusted accordingly 165, typically between the range from 2 to 12 Amps. If the answer at decision point 164 is no, then proceed to the next decision point 166 wherein the question is whether the stress can be controlled by adjusting the voltage over the process window or not. If the answer is yes, then the ion gun current is fixed within the range from 2 to 12 Amps, and the ion gun acceleration voltage is adjusted accordingly 168 over the range from 100 to 300 Volts. If the answer at decision point 166 is no, then adjust and fix the ion gun acceleration voltage within the range from 100 to 300 Volts and proceed to decision point 164 thereby circling around the flow chart.

If the cycle of decision points, from 164 to 166 to 167 and back to 164 has been repeated several times and the stress cannot be controlled within the ion gun voltage process window at decision point 166, then proceed to decision point 169, wherein based on the fact that the ion gun current and voltage limits have been reached without obtaining the desired results, then the question is whether the temperature and pressure can be further adjusted accordingly or not. If the pressure and temperature can be further adjusted, then the pressure and temperature can be varied within the ranges of $10^{-3}$ to $10^{-9}$ torr and $-100$ C to 800 C, respectively and the process development cycles back to decision point 164 wherein the ion gun current is again adjusted to attempt to obtain the desired result. If the answer at decision point 169 is that no further adjustment of the pressure and temperature can be attempted, then it can be concluded that ion bombardment with evaporative PVD deposition will not allow the thin film stress to be controlled to the desired stress state 171.

Figure 14:
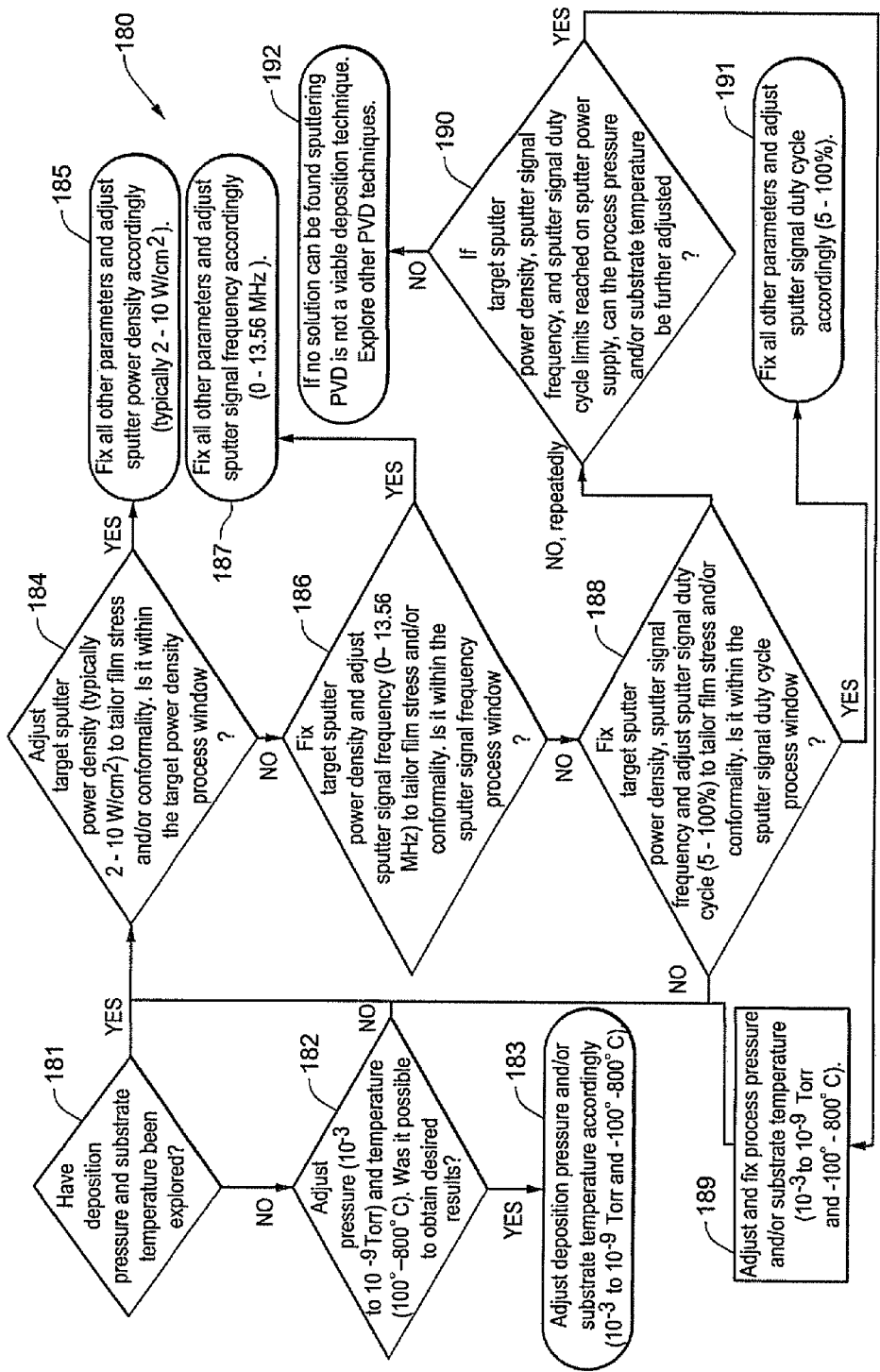
FIG. 14 is a flow chart diagram explaining the procedure to adjust the ion-beam parameters as well as process pressure and substrate temperature so as to control the stress in sputter PVD deposited thin films.

Using Ion Bombardment to Control the Stress of Sputtered PVD Deposited Thin Films:

In the case where evaporation PVD process pressure ($10^{-9}$ to $10^{-3}$ Torr) and substrate temperature ($-100°$ C. to $800°$ C.) have been explored and found not adequate in reducing the thin film stress, adjustment of the inherent bombardment from a sputter source is necessary and is described in flow chart of FIG. 14.

The largest process window achievable is found by adjusting the target sputter power density over the range from 2-10 W/cm'. The target sputter power density controls many aspects of the sputter PVD process of which the most important is the energy of bombarding film material and sputter gas species. In the case where the thin film stress is desired to increase the tensile nature of the stress, the target sputter power density should be decreased. When it is desired to increase the compressive stress, the target sputter power density should be increased. If the target sputter power density adjustment is successful in producing a zero-stress level in the deposited thin film, fix all other process variables and use the adjusted target sputter power density accordingly, typically within the range of 2-10 W/cm$^2$ to obtain the desired stress state the deposited thin film.

In the case where the target sputter power density is not successful in shifting the thin film stress to zero, the sputter signal frequency may be used to expand the sputter deposition process window. The frequency range covers 0 to 13.56 MHz as allowed by the FCC. A frequency of 0 Hz corresponds to direct current (DC) sputtering while the range from >0 Hz to kHz frequencies corresponds to mid-Radio Frequency (mid-RF) or pulsed-DC sputtering and the MHz range frequencies correspond to RF sputtering. Adjustment of the sputter signal frequency changes the nature of the bombarding species at the growing thin film surface as the signal flips from positive to negative and back. With respect to sputter signal frequency, there is no standard adjustment direction to impart more or less energy, since the nature of the energy differs widely as the sputter source, material, and sputter gas chemistry varies. The stress-level effects of increasing or decreasing the sputter signal frequency must be understood before an adjustment direction can be identified. If the target sputter power density is fixed and the sputter signal frequency adjustment is successful in producing a zero-stress level in the deposited thin film, fix all other process variables (process pressure and substrate temperature) and use the adjusted sputter signal frequency accordingly (0-13.56 MHz).

The smallest process window adjustment resides with the sputter signal duty cycle, yet tuning the sputter signal duty cycle can be used in conjunction with the target sputter power density and sputter signal frequency to identify a zero-level thin film stress. The typical range for the sputter signal duty cycle is between 5 and 100%. A sputter signal duty cycle of 100% corresponds to using a DC sputter signal and <100% to pulsed-DC and RF sputter signals. The duty cycle changes the duration of the negative and positive portions of each cycle and thereby imparts varying levels of energy into the growing thin film surface. As with the sputter signal frequency, there is no standard adjustment direction to impart more or less energy since the nature of the energy differs widely as the sputter source, material, and sputter gas chemistry varies. The stress-level effects of increasing or decreasing the sputter signal duty cycle must be understood before an adjustment direction can be identified. If the sputter power density and sputter signal frequency are fixed and the sputter signal duty cycle adjustment is successful in producing a zero-stress level in the deposited thin film, fix all other process variables (process pressure and substrate temperature) and use the adjusted sputter signal duty cycle accordingly (5-100%).

While the process windows associated with sputter signal frequency and sputter signal duty cycle are smaller than that of the target sputter power density alone, it is useful to use in conjunction with other process variables when fine-tuning is necessary. When the zero-point of the film stress cannot be dialed in using fixed target sputter power density and sputter signal frequency and variable sputter signal duty cycle, re-adjustment of the target sputter power density and sputter signal frequency becomes necessary. An accompanying re-adjustment of the sputter signal duty cycle may be needed to fine-tune the stress. Several iterations of this process may be required. If successful the target sputter power density (2-10 W/cm$^2$), sputter signal frequency (0-13.65 MHz), and sputter signal duty cycle (5-100%) will be fixed and thin films of any thickness may be deposited at the zero-stress level. If unsuccessful, a re-adjustment of the process pressure and/or substrate temperature may be necessary since altering either of these process variables will shift the process window obtainable with the sputter process parameters. The adjustment process tbr the sputter process parameters will begin anew at this point.

In the case where no set of sputter process variables can be found that results in a zero-stress level, other PVD techniques must be explored.

The method of obtaining stress controlled sputtered PVD deposition of thin films is shown in the flow chart 180 of FIG. 14. The first decision point 181 is whether varying the substrate temperature and process pressure have been explored to obtain the desired stress state of the thin film. If the answer is no, then varying the process pressure over the range from $10^{-3}$ to $10^{-9}$ torr and the substrate temperature over the range from −100 C to 800 C, can be attempted at the decision point 182. If this allows the desired stress level to be obtained, then the process pressure and substrate temperature can be adjusted accordingly over the range from $10^{-3}$ to $10^{-9}$ torr and from −100 C to 800 C, respectively, to develop a PVD deposition process for a thin film having the desired stress state at step 183. If adjustment of process pressure and substrate temperature do not allow the desired stress state to be obtained during deposition, then the next decision point 184 is whether the sputtering power density can be used within the process window to obtain the desired stress state in the thin film. It the answer at decision point 184 is yes, then all other parameters are fixed and the sputtering power density is adjusted accordingly over the range from 2 to 10 W/cm$^2$ 185 to obtain the desired stress state.

If the answer at decision point 184 is no, then the sputtering power density is fixed at a value and the sputter signal frequency is adjusted over the allowable range from 0 to 13.56 MHz. At decision point 186, it is determined whether the range of sputter signal frequency is within the desired process window. If adjustment of the signal frequency over this range allows the desired stress state to be obtained, then a recipe for the desired process is obtained at step 187. If not, then the sputter power density and the sputtering signal frequency are fixed and the duty cycle is adjusted and it will be determined whether they can be adjusted over the process window at decision point 188. If fixing all other process parameters and adjusting the duty cycle over the range from 5 to 100% allows the desired stress state to be obtained, a process recipe is obtained at step 191. If at decision point 188, that adjusting the duty cycle does not allow the desired process to be obtained, then the process development cycles back to decision point 184 wherein the sputtering power density is attempted to be adjusted again to obtain the desired stress state in the thin film.

If the process development cycle has been repeated some reasonable number of times and at decision point 188 that adjustment of the duty cycle, after the power density and signal frequency have been tuned, and the desired stress state has not been obtained, then the development proceeds to decision point 190 wherein it is asked whether the process pressure and substrate temperature can be further adjusted. If they cannot, it can be determined that no solution for obtaining the desired process recipe using ion bombardment and sputter PVD deposition can be obtained 192. If on the other hand it is determined at decision point 190 that the process pressure and substrate temperature can be further adjusted, then these process parameters are suitably adjusted at step 189 and the process development then cycles back to decision point 184, as shown in the development flow chart 180 of FIG. 14.

A specific example of the method to obtain a desired stress state in a Nickel thin film is now described. It should be noted that Nickel thin films are notoriously difficult to deposit using PVD of any thickness over a few hundred nanometers due to the excessive stresses that these thin films exhibit. Referring to the flow chart 160, of FIG. 13, determination of a process recipe, that is, the exact process settings or parameters, to result in a zero-stress state of the deposited Nickel thin film begins with fixing the process pressure and substrate temperature. The process pressure is a predetermined parameter based upon the specific evaporation system configuration and is set to 1.5E-6 Torr. The substrate temperature is fixed to room temperature (20° C.). With these process parameters fixed, the ion gun current of a gridless, end-Hall type ion source is adjusted. Adjusting the ion gun current to 2A resulted in a Ni film stress of −135 MPa from an initial tensile stress of +1354 MPa. To reduce the Ni film stress further, adjustment of the ion gun voltage to 162 V resulted in a Ni film stress of +27 MPa at a film thickness of 1000 Angstroms. Since 27 MPa considered a very low value, that is, a zero-near value of stress, the process is now considered to be developed so as to allow a zero state of stress in Nickel PVD deposition.

The method for obtaining the desired state of stress in thin films of the present invention can be used for any metal, semiconductor, dielectric, or ceramic material type that can be deposited using means of PVD. Importantly, the example provided for a Nickel thin films had a specific goal of a near-zero state of stress, however it should be understood that the method described in the present invention can be used to obtain a thin films having a compressive stress state or a tensile stress state, as well as a zero stress state. That is, the stress state desired, depending on the device design and application, can be obtained using the present invention. However, for most micro- and nano-fabrication process sequences, it is most often desired that the thin films have either a zero stress state or a mildly tensile (e.g., less than 100 MPa) state of stress.

It is important to note that the present invention allows the temperature of the deposition to be constrained to some pre-determined level and the other process parameters adjusted accordingly to obtain a pre-determined and desired stress state in the deposited thin film. For example, many micro- and nano-fabrication process sequences require that the substrate undergo all processing below some threshold temperature so as to prevent damage or degradation of the material and/or devices already on the substrate sample.

A preferred embodiment of the present invention is to take a substrate having had previously fabricated microelectronics implemented onto the substrate and perform additional processing on the substrate to implement MEMS, NEMS, photonic, or any micro- or nano-devices or structures on the substrate. The previously implemented microelectronics can be of any type of process technology, including but not limited to, Complementary-Metal-Oxide-Semiconductor (CMOS), Bipolar-CMOS or Bi-CMOS, Bipolar technology, Dynamic Random-Access Memory (DRAM) technology, Static Random-Access Memory (SRAM) technology, for example, and can be of any linewidth technology. It is important that the processing on the wafer performed after the microelectronics are complete can be used to enhance the microelectronic devices or add new devices, such as MEMS, NEMS, photonic devices, for example, so as to integrate the MEMS, NEMS, photonics with microelectronics onto the same substrate. The temperature of substrates with pre-existing microelectronics will have a temperature constraint placed on them, whereby the substrates cannot be exposed to temperatures above 400 to 450 C for any significant amount of time, typically only a few minutes, before the pre-existing microelectronics will be damaged or degraded. This present invention can be used to obtain a low stress deposition at a sufficiently low deposition temperature for various thin films for the fabrication of MEMS, NEMS, photonic devices and/or structures directly onto the substrate with pre-existing microelectronics.

An embodiment of the present invention is illustrated in FIG. 1, wherein a CMOS wafer 11 of a three-metal process technology type is shown with integrated MEMS on the wafer to implement an integrated MEMS technology platform. The CMOS wafer 11 has an electronics level 12 that includes the n- and p-type doping regions to implement individual transistors. On the surface of the CMOS wafer 11, there is a multi-stack layer 13 of dielectrics 17 and metals, 14, 15, and 16 to implement the electronic wiring design. Metal layer One 14 is the bottom-most layer of metal, metal layer two 15 is the middle layer of metal, and metal layer Three 16 is the top most layer of metal in the stack.

As shown in FIG. 1, a layer of material 19 deposited, patterned and etched to make part of the MEMS device, in this case of FIG. 1, material 19 is a counter electrode for the movable portion of the MEMS device 18. This is performed on the wafer after the CMOS processed has been completed. Then, a layer of sacrificial material (not shown) is deposited, patterned and etched to define a temporary mechanical support for the MEMS device 18. Photolithography is then performed to pattern the underlying dielectric and metal stack to open up the desired metal layers for electrical contact to the MEMS device 18 to be fabricated on the surface of the CMOS wafer 11. Subsequently, one or more etches are performed to open the desired metal layer. Next, a layer of structural material is deposited, patterned and etched to form the MEMS device 18. This material is deposited, so as to make electrical contact to the underlying exposed metal layers on the CMOS wafer. Lastly, the sacrificial layer is removed, thereby opening a gap 20 between the CMOS wafer top surface and bottom electrode of the MEMS device 19 and the movable portion of the MEMS device 18. This would constitute the fabrication of a surface micromachined MEMS device, such as a Radio Frequency RF switch, an accelerator, a gyroscope, as well as other MEMS devices.

Importantly, the present invention allows the design of process conditions whereby the material layers 19, 20, and 18 can be deposited at a low- or desired level of mechanical stress and the depositions to be performed at temperatures below 450 C thereby eliminating the problem of high-temperature processing that would damage or degrade the pre-existing microelectronics.

Although the example of FIG. 1 portrays the integration of a surface micromachinined MEMS element with microelectronics, it is understood that such a method of the present invention could be used to implement any MEMS, NEMS, photonics, or micro- and nano-device or structure. Moreover, the method of the present invention can be used to implement a plurality of MEMS, NEMS, photonics, or micro- and nano-device or structures with microelectronics.

It is also understood, that the method of the present invention can be used for a variety of material types including but not limited to metals, dielectrics, semiconductors, and ceramics. For example, this method can be used to deposit at low temperatures and low stress states such materials as magnetic thin films.

The method for obtaining the desired state of stress in thin films of the present invention can be followed, as described herein, as a step-by-step process method described that are portrayed in the flow charts of 140, 160 and 180 to obtain the desired result. However, the present invention also includes a software algorithm, whereby the methods described and portrayed in the flow charts are incorporated into a coded set of instructions and decision points. The algorithm has certain inputs that are based on desired material properties and a set of PVD deposition tool settings that can be varied. With these inputs, the algorithm provides the user with directions on which process parameters to adjust in a specific hierarchy, with the most important parameter adjusted, the second most important parameter adjusted next, and so on, until the desired process setting for the desired stress state in the thin film material is obtained. As the user, adjust the process parameters in the hierarchy dictated by the algorithm, the user inputs new results of the process results into the algorithm, and the process settings of the parameters converge onto a set of process parameters providing the desired state of stress for the thin film.

The method for obtaining the desired state of stress in thin films of the present invention as described above as a step-by-step proceed method and which are portrayed in the flow charts of 140, 160 and 180 to obtain the desired result, are essentially an open-loop system. The present invention also includes a method for process parameter monitoring through in situ, closed-loop deposition parameter control for the control of the state of stress in deposited thin films.

Closed-loop deposition parameter control enables pre-determined, as designed, stress-states in deposited thin films, and eliminates the current and unprofitable current method of multiple iterations of process development, adjustment, and characterization that are necessary in open-loop deposition systems because of process drift and as a result uncontrolled film stress states. While the method of open loop thin film deposition is effective, it can be costly and time consuming and also consumes an inordinate amount of resources. In contrast, the ability to obtain thin film depositions with pre-determined stress states using closed-loop control of the deposition process as described in the present invention, is a further enormous improvement over the current methods.

The present invention also includes a system by which the stress state in the thin film can be closed-loop controlled using in situ thin film residual stress monitoring for determining bombardment specie and energy, which will reduce significantly the number and length of depositions and post-deposition stress measurements that are needed to develop a set of process parameters for the PVD deposition process wherein a desired and pre-determined state of stress of thin film can be obtained.

Figure 15:
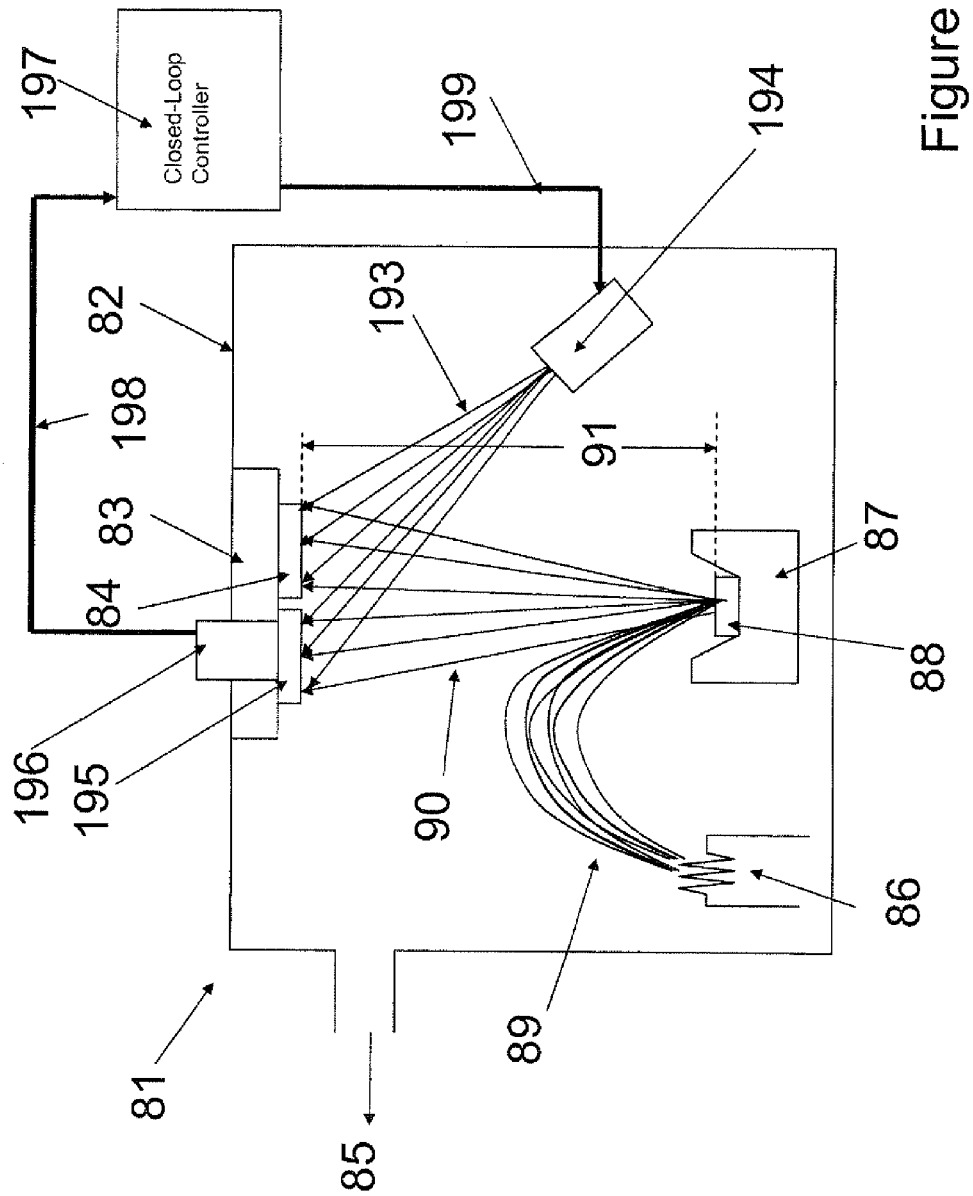
FIG. 15 is an illustration of an evaporative physical vapor deposition system that includes an ion beam source for ion-assisted deposition; a means for substrate temperature control allowing both heating and cooling of the substrate; a means for pressure measurement and control inside the deposition chamber; sensors to allow the stress and stress gradient to be measured during deposition; and a closed-loop control system allowing a desired and pre-determined stress state of the deposited thin film to be obtained.

FIG. 15 shows a evaporation PVD system 81 wherein an ion beam source 194 is included 194 in the chamber 82 that has the ion beam 193 directed from the ion beam source 194 onto the substrate 84. Included in the evaporation system 81 is a closed-loop control system to automatically adjust the process parameters so as to obtain the desired stress state of the deposited thin film. The closed-loop control system includes a stress monitoring system 196 that provide real-time in situ measurement of the film stress on a sensor 195 that experiences the same process conditions as the substrate 84. The data from the stress monitoring system 196 is fed back through a communication line 198 into the closed-loop controller 197 which takes the measurement data and based on the algorithm provides electrical signals through a communication line 199 to the ion beam source 194 so as to adjust the ion beam current and voltage to values that more properly met the stress state values that are desired. The closed-loop controller also is connected to sensors for both the process chamber pressure and the substrate temperature as well as the deposition rate and all of these measurements are taken collectively together and used in the algorithm to automatically adjust in real time the process parameters so as to obtain a pre-determined state of stress in thin films deposited using PVD.

It should be noted that while FIG. 15 illustrates a closed-loop PVD deposition system based on evaporative deposition, that the same invention of closed-loop control can be implemented for sputter PVD deposition.

In lieu of bombardment with an inert gas, a reactive gas such as oxygen or nitrogen may be used to not only supply energy to the growing thin film by transfer of kinetic energy to adatoms, but also tailor the composition of the thin film material in the present invention. This is particularly useful when depositing oxides and nitrides, since the bombardment with oxygen and nitrogen will result in incorporation of these atoms through chemical reaction and implantation in the film and provide stoichiometric modification, where otherwise the deposited oxide or nitride would be sub-stoichiometric. Regarding deposited nitrides, nitrogen is notoriously hard to disassociate from its diatomic form and react to form a nitride in the absence of a plasma. The ion-assisted deposition (IAD) of the present invention using oxygen or nitrogen can supply the growing film with the specie necessary to correct for standard evaporation PVD compositional shortcomings as well as provide stress control.

Using the thin film stress-control strategies of the present invention allows the design window for micro- and nanofabricated devices and structures to be increased thereby increasing dramatically the number and diversity of materials that are able to be consistently deposited in a pre-determined, that is, "as designed" stress-state. In turn, this enables an increase in the overall design window, removes current device design restrictions, improves production yields, decreases development costs and times, increases the performance of devices, and increases the number of device types that can be produced due to removal of current design limitations. The impact is to lower costs to designers and developers of micro- and nano-devices and structures due to enabling higher fabrication yields.

The present invention allows designers and developers of micro- and nano-devices and structures to design the stress-state of thin films which also allows the prediction of the performance of the fabricated devices with a high level of certainty, thereby lowering costs, development time, and risks.

While the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. A method of controlling excessive stress beyond a predetermined range of stress in thin films being deposited by physical vapor deposition ("PVD") on substrates containing previously fabricated microelectronics to fabricate micro-electro-mechanical systems ("MEMS"), nano-electro-mechanical systems ("NEMS"), photonic, micro-devices or nano-devices on the substrates, the method comprising the steps of:
    a) determining whether changes in the thin films' morphology or conformality or morphology and conformality degree(s) is/are tolerable with regard to the micro- or nano-devices fabricated from the thin films being able to function as designed,
    b) for thin films where changes in their morphology or conformality or morphology and conformality degree(s) is/are intolerable, determining whether adjusting thin film deposition process pressure will change their degree(s) of morphology or conformality or morphology and conformality, such that the micro- or nano-devices fabricated with the changed thin films will not function as designed,
    c) for thin films where adjusting the thin film deposition pressure will not change their degree(s) of morphology or conformality or morphology and conformality, such that the fabricated micro- or nano-devices will function as designed, adjusting the thin film deposition process pressure within a predetermined pressure process window to change the thin film stress level from being excessive and towards zero stress,
    d) for thin films where changes in their degree(s) of morphology or conformality or morphology and conformality is/are tolerable, where thin film tensile stress is to be increased, increasing the process pressure to change the thin film stress level, and where thin film compressive stress is to be increased, decreasing the process pressure to change the thin film stress level, and then determining whether achieving a thin film stress level towards zero is within a predetermined pressure process window,
    e) for thin films where stress level can not be controlled so as to not be excessive while the process pressure is maintained within the predetermined pressure process window, or where adjusting the process pressure will change their degree(s) of morphology or conformality or morphology and conformality, such that the fabricated micro- or nano-devices will not function as designed, determining whether a higher or lower substrate temperature will change the thin film stress level from being excessive and towards a level of zero stress,
    f) for thin films where a higher or lower substrate temperature can not be used to change the thin film stress level, while making no further changes in the process pressure or in the substrate temperature, using thin film ion bombardment to reduce thin film energy and thereby thin film stress,
    g) for thin films where a higher or lower substrate temperature can be used to change thin film stress level, determining whether adjusting substrate temperature will change their degree(s) morphology or conformality or morphology and conformality, such that the fabricated micro- or nano-devices will not function as designed,
    h) for thin films where a higher or lower substrate temperature will change their degree(s) of morphology, conformality or morphology and conformality, such that the fabricated micro- or nano-devices will not function as designed, using thin film ion bombardment, while making no further changes in the process pressure or in the substrate temperature, to reduce thin film energy and thereby thin film stress,
    i) for thin films where the higher or lower substrate temperature will not change their degree(s) of morphology or conformality or morphology and conformality, such that the fabricated micro- or nano-devices will function as designed, and where increasing thin film tensile stress by decreasing substrate temperature, or increasing thin film compressive stress by increasing substrate temperature enables the thin film stress level to be changed from being excessive and towards the level of zero stress, adjusting the substrate temperature within a temperature process window to thereby change the thin film stress level from being excessive and towards the level of zero stress,
    j) for thin films where adjusting the substrate temperature within a predetermined temperature process window will not result in a change in the thin film stress level from being excessive and towards zero stress, using thin film ion bombardment using an ion gun, while making no further changes in the process pressure or in the substrate temperature, to reduce thin film energy and thereby thin film stress, and
    k) maintaining substrate temperature below a temperature that would result in the previously fabricated micro- or nano-devices not functioning as designed.

2. The method of claim 1, wherein the predetermined range of stress is ±200 megapascals (MPa).

3. The method of claim 1, wherein the predetermined pressure process window is from $10^{-3}$ to $10^{-9}$ Torr.

4. The method of claim 1, wherein adjusting the deposition pressure within the predetermined pressure process window to change the thin film stress level from being excessive and towards zero stress comprises, for thin films where the tensile stress needs to be increased to change the thin film stress level to below +200 MPa and towards zero stress, increasing the process pressure to so change the stress level in the thin film, and for thin films where the compressive stress needs to be increased to change the thin film stress level to above −200 MPa and towards zero stress, decreasing the process pressure to so change the thin film stress level.

5. The method of claim 1, wherein the lower substrate temperature is below 0° C. and the higher substrate temperature is greater than 250° C.

6. The method of claim 1, wherein the predetermined temperature process window comprises a range of temperatures from −100° C. to +800° C.

7. The method of claim 1, wherein adjusting the substrate temperature within the predetermined temperature process window to change the thin film stress level from being excessive and towards zero stress comprises, when the tensile stress in the thin film needs to be increased to change the thin film stress level to below +200 MPa and towards zero stress, decreasing the substrate temperature to a temperature between 20° C. and −100° C. to so change the stress level in the thin film, and when the compressive stress in the thin film needs to be increased to change the stress in the thin film to above −200 MPa and towards zero stress, increasing the substrate temperature to to a temperature between 20° C. and 800° C. to so change the stress in the thin film.

8. The method of claim 1, wherein the substrate temperature is lowered through cooling of the substrate using liquid nitrogen or chilled water or another liquid or gas coolant.

9. The method of claim 1, wherein the substrate temperature is increased through heating the substrate with a resistive heater in contact with the substrate or by irradiation of the substrate from a source of infrared radiation or visible wavelengths.

10. The method of claim 1 further comprising, where the thin film is being deposited on the substrate by evaporated physical vapor deposition and the thin film is being bombarded by ions to reduce stress, the steps of:
  l) for thin films where tensile stress is to be increased to reduce the thin film stress level, decreasing ion gun current below a predetermined first current level, and then determining whether achieving a thin film stress level towards zero is within a predetermined ion gun current process window,
  m) for thin films where compressive stress is to be increased to increase the stress level to above −200 MPa and towards zero stress, increasing ion gun current to be within the predetermined ion gun current process window, and then determining whether achieving a thin film stress level towards zero is within the predetermined ion gun current process window,
  n) for thin films where achieving a stress level towards zero is within the predetermined ion gun current process window, while not changing ion gun acceleration voltage, adjusting the ion gun current accordingly so that the thin film stress is changed to be within the predetermined ion gun current process window and thereby not be excessive and moves towards zero stress,
  o) for thin films where achieving a stress level towards zero is not within the ion gun current process window, where thin film tensile stress is to be increased to reduce the thin film stress level, decreasing ion gun acceleration voltage below a first voltage level, and then determining whether achieving a thin film stress level towards zero is within a predetermined ion gun voltage process window,
  p) for thin films where achieving a stress level towards zero is not within the ion gun current process window, where thin film compressive stress is to be increased to reduce the thin film stress level, increasing ion gun acceleration voltage above a second voltage level, and then determining whether achieving a thin film stress level towards zero is within the predetermined ion gun voltage process window,
  q) for thin films where achieving a stress level towards zero is within the predetermined ion gun voltage process window, while not changing the ion gun current, adjusting the ion gun acceleration voltage accordingly within the predetermined ion gun voltage process window so that the thin film stress is changed to not be excessive and moves towards zero stress,
  r) for thin films where achieving a stress level towards zero is not within the ion gun voltage process window, adjusting and fixing the ion gun acceleration voltage to be within the predetermined ion gun voltage process window, repeating adjusting the ion gun current and ion gun acceleration voltage to determine whether achieving a thin film stress level towards zero is within the predetermined ion gun current process window or the predetermined ion gun voltage process window,
  s) for thin films where achieving a stress level towards zero is determined a plurality of times to not be within the predetermined ion gun current process window or the predetermined ion gun voltage process window, even with further current and/or voltage adjustments on the ion gun, determining whether further adjustments of the process pressure or substrate temperature or process pressure and substrate temperature will reduce the excessive thin film stress level towards zero stress,
  t) for thin films where adjusting ion gun current, ion gun acceleration voltage, process pressure or substrate temperature does not reduce the excessive thin film stress level towards zero, exploring other physical vapor deposition techniques to control the thin film stress.

11. The method of claim 10, wherein the predetermined first current level is below 2 amps, the predetermined first current range is 2-12 amps and the predetermined ion gun current process window is 2-12 amps.

12. The method of claim 10, wherein adjusting ion source current to change the thin film stress level from being excessive and towards zero stress comprises, when the thin film tensile stress needs to be increased to change the thin film stress level towards zero stress, decreasing the ion source current to at least below 2 amps to so change the thin film stress level, and when the thin film compressive stress needs to be increased to change thin film stress level towards zero stress, increasing the ion source current to at least above 2 amps to so change thin film stress level.

13. The method of claim 10, wherein the predetermined first ion gun acceleration voltage level is below 200 volts, the predetermined second ion gun acceleration voltage level is above 200 volts and the predetermined ion gun voltage process window is within a range of 100-300 volts.

14. The method of claim 10, wherein the predetermined pressure process window is from $10^{-3}$ to $10^{-9}$ Torr and the predetermined temperature process window is from −100° to +800° C.

15. The method of claim 1, wherein adjusting ion source voltage to change the thin film stress level from being excessive and towards zero stress comprises, when the thin film tensile stress needs to be increased to change the thin film stress level towards zero stress, decreasing the ion source voltage to at least below 200 volts to so change the thin film stress level, and when the thin film compressive stress needs to be increased to change the thin film stress level towards zero stress, increasing the ion source voltage to at least above 200 volts to so change the thin film stress level.

16. The method of claim 1 further comprising, where the thin film is being deposited on the substrate by sputtering physical vapor deposition and the thin film is being bombarded by ions to reduce stress, the steps of:
l) adjusting target sputter power density to adjust thin film stress or thin film conformality or thin film stress and thin film conformality, and then determining whether achieving a thin film stress level towards zero is within a predetermined target sputter power density process window,
m) for thin films where achieving a stress level towards zero is within the target power density process window, while not changing all other process parameters, adjusting sputter power density accordingly within the predetermined target power density process window so that the thin film stress level is changed to not be excessive and moves towards zero stress,
n) for thin films where achieving a stress level towards zero is not within the predetermined target power density process window, while not changing target sputter power density, adjusting sputter signal frequency to be within a predetermined sputter signal frequency process window, to thereby adjust thin film stress or thin film conformality or thin film stress and thin film conformality, and then determining whether achieving a thin film stress level towards zero is within the predetermined sputter signal frequency process window,
o) for thin films where achieving a stress level towards zero is within the sputter signal frequency process window, while not changing all other process parameters, adjusting sputter signal frequency accordingly within a predetermined sputter signal frequency process window so that the thin film stress is changed to not be excessive and moves towards zero stress,
p) for thin films where achieving a stress level towards zero is not within the predetermined sputter signal frequency process window, while not changing target sputter power density and sputter signal frequency, adjusting sputter signal duty cycle to be within a predetermined sputter signal duty cycle process window, to thereby adjust thin film stress or thin film conformality or thin film stress and thin film conformality, and then determining whether achieving a thin film stress level towards zero is within the predetermined sputter signal duty cycle process window,
q) for thin films where achieving a stress level towards zero is within the predetermined sputter signal duty cycle process window, while not changing all other parameters, adjusting sputter signal duty cycle accordingly within the predetermined sputter signal duty cycle process window so that the thin film stress is changed to not be excessive and moves towards zero stress,
r) for thin films where achieving a stress level towards zero is not within the predetermined sputter signal duty cycle process window, repeating the steps of adjusting the target sputter power density, sputter signal frequency or sputter signal duty cycle to t to determine whether achieving a thin film stress level towards zero is within the predetermined target sputter power density process window, the predetermined sputter signal frequency process window or the predetermined sputter signal duty cycle process window,
s) for thin films where achieving a stress level towards zero is determined a plurality of times to not be within the predetermined target sputter power density process window, the predetermined sputter signal frequency process window or the predetermined sputter signal duty cycle process window, even with further adjustments of target sputter power density, sputter signal frequency or sputter signal duty cycle, determining whether further adjustments of the process pressure or substrate temperature or process pressure and substrate temperature will reduce the excessive thin film stress level towards zero stress, and
t) for thin films where adjusting sputter power density, sputter signal frequency, sputter signal duty cycle, process pressure or substrate temperature does not reduce the excessive thin film stress level towards zero, exploring other physical vapor deposition techniques to control the thin film stress.

17. The method of claim 16, wherein the predetermined target power density process window is from 2 to 10 W/cm$^2$.

18. The method of claim 16, wherein the predetermined sputter signal frequency process window is from 0-13.56 MHz.

19. The method of claim 16, wherein the predetermined sputter signal duty cycle process window is from 5 to 100%.

20. The method of claim 16, wherein adjusting the target sputter power density to change the thin film stress level from being excessive and towards zero stress comprises, when the thin film tensile stress needs to be increased to change the thin film stress level towards zero stress, decreasing the target sputter power density to so change the thin film stress level, and when the thin film compressive stress needs to be increased to change the thin film stress level towards zero stress, increasing the target sputter power density to so change the thin film stress level.

21. The method of claim 20, wherein a surface micromachined MEMS, NEMS, and/or photonics device is integrated onto an integrated circuit electronics wafer and the micromachined MEMS, NEMS, and/or photonics device is made from one or more thin films having a controlled and predetermined level of stress and the temperature of the processes employed to deposit the thin films used in fabricating the MEMS, NEMS, and/or photonics device are kept below a temperature that would degrade the electronics on the integrated circuit electronics wafer, the method comprising the steps of:
taking a previously fabricated integrated circuit electronics wafer;
performing one or more photolithography and etching steps on the integrated circuit wafer to expose one or more metal layers on the surface of the previously fabricated integrated circuits wafer;
depositing one or more first material thin film layers with a predetermined level of stress onto the surface of the integrated circuits wafer wherein the first material thin film layers make electrical contact to the desired metal layers on the previously fabricated integrated circuits wafer;
performing one or more photolithography and etching steps to pattern the first material thin film layers into the desired shapes and dimensions;
depositing one of more sacrificial thin film layers with a predetermined level of stress onto the surface of the integrated circuits wafer;

performing one or more photolithography and etching steps to pattern the sacrificial layers into the desired shapes and dimensions;

performing one or more photolithography and etching steps on the integrated circuit wafer to expose one or more metal layers on the surface of the previously fabricated integrated circuits wafer;

depositing one or more second material thin film layers with a predetermined level of stress onto the surface of the integrated circuits wafers wherein the second material thin film layers contact the desired metal layers in the metal stack on the integrated circuits wafer;

performing one of more photolithography and etching steps to pattern the second material thin film layers into the desired shapes and dimensions;

performing an etch to remove the sacrificial layers thereby releasing the moveable portion of the MEMS device.

22. The method of claim 21, wherein the first and second material thin film layers and the sacrificial material layers are composed of a metal, semiconductor, dielectric and/or ceramic material.

23. The method of claim 21, wherein the first and second material thin film layers are composed of a metal and the sacrificial material layer is composed of a dielectric.

24. The method of claim 21, wherein the first and second material thin film layers are composed of a semiconductor and the sacrificial material layer is composed of a dielectric.

25. The method of claim 21, wherein the first material thin film layer is a metal and the second material thin film layer is a semiconductor and the sacrificial material layer is composed of a dielectric.

26. The method of claim 21, wherein the first material thin film layer is a semiconductor and the second material thin film layer is a metal and the sacrificial material layer is composed of a dielectric.

27. The method of claim 21, wherein the first and second thin film layers are a ceramic.

28. The method of claim 27, wherein the ceramic is a magnetic material.

29. The method of claim 21, wherein integrated circuits electronics wafers is from one of the following types: Complementary-Metal-Oxide Semiconductor (CMOS); Bipolar-CMOS (Bi-CMOS); Bipolar technology; Dynamic Random-Access Memory (DRAM); or Static Random-Access Memory (SRAM).

30. The method of claim 29, wherein the integrated circuits electronic wafer employs any linewidth technology.

31. The method of claim 21, wherein first material thin film layers, the sacrificial layers, and the second material thin film layers are all deposited at temperature below 450 C.

32. The method of claim 21, wherein first material thin film layers, the sacrificial layers, and the second material thin film layers are all deposited at temperature below 400 C.

33. The method of claim 20, wherein the method is incorporated in a set of coded instructions and decision points that constitute a software algorithm; and wherein the algorithm allows certain inputs that are based on desired material properties and a set of PVD deposition tool settings that can be varied; and using these inputs, the algorithm provides a user with directions on which process parameters to adjust in a specific hierarchy, with the most important parameter adjusted, the second most important parameter adjusted next, and so on, until the desired process setting for the desired stress state in the thin film material is thereby obtained; and as the user adjusts the process parameters in the hierarchy dictated by the algorithm, the user inputs new results of the process results into the algorithm; and the cycle being repeated until the process settings of the parameters converge onto a set of process parameters providing a state of stress for the thin film within the predetermined range of stress.

34. The method of claim 20, wherein the method employs a a closed-loop control system and a software algorithm that is a set of coded instructions and decision points; and wherein the algorithm allows certain inputs that are based on determined material properties and a set of PVD deposition tool settings that can be varied; and the closed-loop control system includes a stress monitoring system that measures the stress in the thin film layer as it is being deposited; and data from the stress monitoring system is fed back through a communication line into a closed-loop controller which takes stress measurement data and, based on the algorithm, provides electrical signals through the communication line to an ion beam source so as to adjust the ion beam current and voltage to values that more properly met stress state values that are within the predetermined range of stress; and the closed-loop controller also is connected to sensors for process chamber pressure, substrate temperature and deposition rate, and wherein the process chamber pressure, substrate temperature and deposition rate measurements are collectively taken together and used in the algorithm to automatically adjust in real time process parameters so as to obtain a pre-determined state of stress in thin films deposited using PVD that is within the predetermined range of stress.

* * * * *